US011803256B2

(12) United States Patent
Shim et al.

(10) Patent No.: US 11,803,256 B2
(45) Date of Patent: Oct. 31, 2023

(54) DISPLAY DEVICE AND TOUCH INPUT SYSTEM INCLUDING THE SAME

(71) Applicant: SAMSUNG DISPLAY CO., LTD., Yongin-si (KR)

(72) Inventors: Chang Woo Shim, Cheonan-si (KR); Won Sang Park, Yongin-si (KR); Gi Na Yoo, Cheonan-si (KR); Seong Jun Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/698,225

(22) Filed: Mar. 18, 2022

(65) Prior Publication Data

US 2023/0023671 A1 Jan. 26, 2023

(30) Foreign Application Priority Data

Jul. 26, 2021 (KR) .................. 10-2021-0097684

(51) Int. Cl.
*G06F 3/03* (2006.01)
*G06F 3/044* (2006.01)
(Continued)

(52) U.S. Cl.
CPC .......... *G06F 3/0321* (2013.01); *G06F 3/0412* (2013.01); *G06F 3/0446* (2019.05);
(Continued)

(58) Field of Classification Search
CPC ............... H01L 27/322; H01L 27/323; G06F 2203/04112; G06F 3/0412;
(Continued)

(56) References Cited

U.S. PATENT DOCUMENTS 5,477,012 A * 12/1995 Sekendur ............... G06V 10/12
178/18.09
9,170,449 B2 10/2015 Baek et al.
(Continued)

FOREIGN PATENT DOCUMENTS

EP 2759873 7/2014
JP 2014-048728 3/2014
(Continued)

OTHER PUBLICATIONS

Extended European Search Report dated Dec. 20, 2022 in corresponding Application No. EP 22183301.5.

*Primary Examiner* — Sanjiv D. Patel
(74) *Attorney, Agent, or Firm* — F. Chau & Associates, LLC

(57) ABSTRACT

A display device includes a display layer, a plurality of touch electrodes, a light shield, and a code pattern. The display layer includes a plurality of light emission areas for emitting light. The plurality of touch electrodes are disposed on the display layer to sense a touch and surround the plurality of light emission areas. The light-shield is disposed on a portion of the plurality of touch electrodes. The code pattern is determined by a planar shape of the light-shield to have position information. The light-shield absorbs light of a specific wavelength, and another portion of the touch electrodes, which is not overlapped with the light-shield, reflects light of the specific wavelength.

24 Claims, 28 Drawing Sheets

(51) Int. Cl.
*G06F 3/041* (2006.01)
*H10K 50/86* (2023.01)
*H10K 50/844* (2023.01)
*H10K 59/12* (2023.01)
*H10K 59/38* (2023.01)
*H10K 59/40* (2023.01)

(52) U.S. Cl.
CPC ........... *H10K 50/844* (2023.02); *H10K 50/86* (2023.02); *H10K 50/865* (2023.02); *H10K 59/12* (2023.02); *H10K 59/38* (2023.02); *H10K 59/40* (2023.02); *G06F 2203/04111* (2013.01)

(58) Field of Classification Search
CPC ......... G06F 3/044–0448; G06F 3/0446; G06F 3/0443; G06F 3/041662; G06F 2203/04104; G06F 2203/04107; G06F 3/0488; G06F 3/041; G06F 2203/04111; H03K 17/962; H03K 17/955; H03K 17/9622; H01K 50/40
See application file for complete search history.

(56) References Cited

U.S. PATENT DOCUMENTS

| | | | |
|---|---|---|---|
| 9,495,041 | B2 | 11/2016 | Baek et al. |
| 2012/0249490 | A1 | 10/2012 | Lee et al. |
| 2013/0093733 | A1* | 4/2013 | Yoshida ................ G06F 3/0321 345/76 |
| 2013/0255998 | A1* | 10/2013 | Iwami ................... G06F 3/0446 29/850 |
| 2013/0321357 | A1 | 12/2013 | Yamada et al. |
| 2014/0184507 | A1 | 7/2014 | Yamada et al. |
| 2015/0123935 | A1* | 5/2015 | Park ...................... G06F 3/0448 345/174 |
| 2017/0364194 | A1* | 12/2017 | Jang ................... H10K 59/1213 |
| 2018/0299603 | A1* | 10/2018 | Lee ...................... G02B 5/3016 |
| 2019/0034010 | A1* | 1/2019 | Lee .......................... G06F 3/047 |
| 2019/0051711 | A1 | 2/2019 | Lee et al. |
| 2020/0161382 | A1* | 5/2020 | Lee ........................ G06F 3/0412 |
| 2021/0141490 | A1 | 5/2021 | Bang et al. |
| 2021/0226174 | A1 | 7/2021 | Kim et al. |
| 2022/0165993 | A1* | 5/2022 | Leng ..................... H10K 50/844 |

FOREIGN PATENT DOCUMENTS

| | | |
|---|---|---|
| KR | 10-1497524 | 3/2015 |
| KR | 10-2001152 | 10/2019 |

* cited by examiner

DISPLAY DEVICE AND TOUCH INPUT SYSTEM INCLUDING THE SAME

CROSS-REFERENCE TO RELATED APPLICATION

This U.S. non-provisional patent application claims priority under 35 U.S.C. § 119 to Korean Patent Application No. 10-2021-0097684 filed on Jul. 26, 2021, in the Korean Intellectual Property Office, the disclosure of which is incorporated by reference in its entirety herein.

TECHNICAL FIELD

The present disclosure relates to a display device and a touch input system including the same.

DESCRIPTION OF RELATED ART

The demand for a display device for displaying an image is ever increasing. For example, the display device has been applied to various electronic devices such as a smart phone, a digital camera, a laptop computer, a navigation device and a smart television. The display device may be a flat panel display device such as a liquid crystal display device, a field emission display device and an organic light-emitting display device. Among the flat panel display devices, the light-emitting display device includes a light-emitting element in which pixels of a display panel self-emit light so that an image can be displayed without a backlight.

A touch display device can receive an input using a portion (e.g., finger) of a user's body or and an input using an input pen. The display device may sense the input more precisely than when using only input using a portion of the user's body by sensing the input using a stylus pen.

SUMMARY

An object of the present disclosure is to provide a display device and a touch input system including the same, in which input coordinate data of an input device may be generated without complex calculation and correction when the input device is used to apply an input to the display device, whereby a corresponding function may be performed based on an accurate input coordinate, costs may be reduced, power consumption may be reduced, and a driving process may be simplified.

The objects of the present disclosure are not limited to those mentioned above and additional objects of the present disclosure, which are not mentioned herein, will be clearly understood by those skilled in the art from the following description of the present disclosure.

According to an embodiment of the disclosure, a display device includes a display layer, a plurality of touch electrodes, a light shield, and a code pattern. The display layer includes a plurality of light emission areas for emitting light. The plurality of touch electrodes are disposed on the display layer to sense a touch and surround the plurality of light emission areas. The light-shield is disposed on a portion of the plurality of touch electrodes. The code pattern is determined by a planar shape of the light-shield to have position information. The light-shield absorbs light of a specific wavelength, and another portion of the touch electrodes, which is not overlapped with the light-shield, reflects light of the specific wavelength.

An outer periphery of the code pattern may have a closed loop shape.

When the code pattern surrounds the plurality of light emission areas, the code pattern may have a mesh structure on a plane.

The plurality of light emission areas may include first to third light emission areas having their respective sizes different from each other, and perimeters of the code patterns surrounding each of the first to third light emission areas may be different from each other.

The display layer may include a substrate, a thin film transistor layer disposed on the substrate, comprising a plurality of thin film transistors, a light-emitting element layer disposed on the thin film transistor layer, comprising a plurality of light-emitting elements, and an encapsulation layer covering the light-emitting element layer. The plurality of touch electrodes may be disposed on the encapsulation layer.

The display device may further include a plurality of color filters disposed in the plurality of light emission areas on the display layer. The light-shield may surround a portion of the plurality of color filters on the display layer.

The display device may further comprise a reflective layer disposed on another portion of the touch electrodes on the display layer, surrounding another portion of the plurality of color filters.

The reflective layer may include an absorbing material to visible light and a light reflective material to reflect light of the specific wavelength.

The display device may further include an insulating layer covering the light-shield, and a plurality of color filters disposed in the plurality of light emission areas on the insulating layer. The light-shield may surround a portion of the plurality of color filters on the insulating layer.

The display layer may include a substrate, a thin film transistor layer disposed on the substrate, comprising a plurality of thin film transistors, a light-emitting element layer disposed on the thin film transistor layer, comprising a plurality of light-emitting elements, and a wavelength converter disposed on the light-emitting element layer to correspond to the plurality of light emission areas, converting a peak wavelength of light provided from the plurality of light-emitting elements.

The display layer may include a first substrate, a thin film transistor layer disposed on the first substrate, comprising a plurality of thin film transistors, and a light-emitting element layer disposed on the thin film transistor layer, comprising a plurality of light-emitting elements. The display device may further include a polarizing film disposed on the light-emitting element layer, and a second substrate disposed on the polarizing film. The plurality of touch electrodes may be disposed on the second substrate.

The display layer may include a first substrate, a thin film transistor layer disposed on the first substrate, comprising a plurality of thin film transistors, and a light-emitting element layer disposed on the thin film transistor layer, comprising a plurality of light-emitting elements. The display device may further include a second substrate disposed on the light-emitting element layer, a touch sensing layer disposed on the second substrate, comprising the plurality of touch electrodes and the light-shield, and a polarizing film disposed on the touch sensing layer.

According to an embodiment of the disclosure, a display device includes a display layer, a plurality of touch electrodes, a light-shield, and a code pattern. The display layer includes a plurality of light emission areas for emitting light. The plurality of touch electrodes are disposed on the display layer to sense a touch and surround the plurality of light emission areas. The light-shield covers a portion of the plurality of touch electrodes. The code pattern is determined by a planar shape of another portion of the touch electrodes, which is not covered by the light-shielding part, to have position information.

The light-shield may include a light absorbing material to absorb light of a specific wavelength, and another portion of the touch electrodes, which is not covered by the light-shielding part, may include a light reflective material to reflect light of the specific wavelength.

In an embodiment, an outer periphery of the code pattern has a closed loop shape, the code pattern surrounds the plurality of light emission areas, and the code pattern has a mesh structure on a plane.

The display layer may include a substrate, a thin film transistor layer disposed on the substrate, comprising a plurality of thin film transistors, a light-emitting element layer disposed on the thin film transistor layer, comprising a plurality of light-emitting elements, and an encapsulation layer covering the light-emitting element layer. The plurality of touch electrodes may be disposed on the encapsulation layer.

According to an embodiment of the disclosure, a display device includes a display layer, a plurality of touch electrodes, a first light-shield, a second light-shield, and a code pattern. The display layer includes a plurality of light emission areas for emitting light. The plurality of touch electrodes are disposed on the display layer to sense a touch and surround the plurality of light emission areas. The first light-shield is disposed on a portion of the plurality of touch electrodes. The second light-shield covers the plurality of touch electrodes and the first light-shield. The code pattern is determined by a planar shape of the first light-shield to have position information.

The first light-shield may include a light-absorbing material to absorb light of a specific wavelength, and another portion of the touch electrodes, which is not overlapped with the light-shielding pattern, may include a light-reflective material to reflect light of the specific wavelength.

In an embodiment, an outer periphery of the code pattern has a closed loop shape, the code pattern surrounds the plurality of light emission areas, and the code pattern has a mesh structure on a plane.

The display layer may include a first substrate, a thin film transistor layer disposed on the first substrate, comprising a plurality of thin film transistors, and a light-emitting element layer disposed on the thin film transistor layer, comprising a plurality of light-emitting elements. The display device may further include a wavelength conversion layer disposed on the light-emitting element layer to correspond to the plurality of light emission areas, comprising a plurality of wavelength converters converting a peak wavelength of light provided from the plurality of light-emitting elements, and a second substrate disposed on the wavelength conversion layer. The first light-shield may be disposed below the second substrate to surround a portion of the plurality of wavelength converters.

The display layer may include a first substrate, a thin film transistor layer disposed on the first substrate, comprising a plurality of thin film transistors, and a light-emitting element layer disposed on the thin film transistor layer, comprising a plurality of light-emitting elements. The display device may further include a plurality of wavelength converters disposed on the light-emitting element layer to correspond to the light emission areas, converting a peak wavelength of light provided from the plurality of light-emitting elements. The plurality of touch electrodes may be disposed on the light-emitting element layer to surround the plurality of wavelength converters.

The display layer may include a first substrate, a thin film transistor layer disposed on the first substrate, comprising a plurality of thin film transistors, and a light-emitting element layer disposed on the thin film transistor layer, comprising a plurality of light-emitting elements. The display device may further include a polarizing film disposed on the light-emitting element layer, a touch sensing layer disposed on the polarizing film, comprising the plurality of touch electrodes and the first light-shield, and a second substrate disposed on the touch sensing layer. The light-shield may be disposed on a lower surface of the second substrate.

According to an embodiment of the disclosure, a touch input system includes a display device for displaying an image, and an input device for inputting a touch to the display device. The display device includes a display layer, a plurality of touch electrodes, a light shield, and a code pattern. The display layer includes a plurality of light emission areas for emitting light. The plurality of touch electrodes are disposed on the display layer to sense a touch and surround the plurality of light emission areas. The light-shield covers a portion of the plurality of touch electrodes. The code pattern is determined by a planar shape of the light-shielding part to have position information. The light-shield absorbs light of a specific wavelength, and another portion of the touch electrodes, which is not covered by the light-shielding part, reflects light of the specific wavelength. The input device converts the code pattern into preset data codes by photographing the code pattern and transmits coordinate data determined from the data codes to the display device.

The input device may include a camera for photographing the code pattern, a processor for analyzing an image of the code pattern to convert the image into preset data codes and generating coordinate data from the preset data codes, and a communication module for transmitting the coordinate data to the display device.

The display device may further include a communication unit for receiving the coordinate data from the communication module and a main processor for generating image data based on the coordinate data. The display layer may be for displaying an image based on the image data.

In a display device and a touch input system including the same according to at least one embodiment of the present disclosure, the display device may include a code pattern determined by a planar shape of a light-shield, a touch electrode or a light-shielding pattern to have position information, thereby receiving an input of an input device such as an input pen. At least one code pattern or combination of the code patterns may have position information based on a specific reference, and may correspond to preset data codes in a one-to-one relationship. Therefore, the display device and the touch input system including the same may generate coordinate data from the data codes without complex calculation and correction, thereby performing a corresponding function based on an accurate input coordinate, reducing costs, reducing power consumption, and simplifying a driving process. Also, the display device and the touch input system including the same may include a light-shield or light-shielding pattern covering a portion of the touch electrode, thereby being applied to all electronic devices having a touch function without restriction in size.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Figure 1:
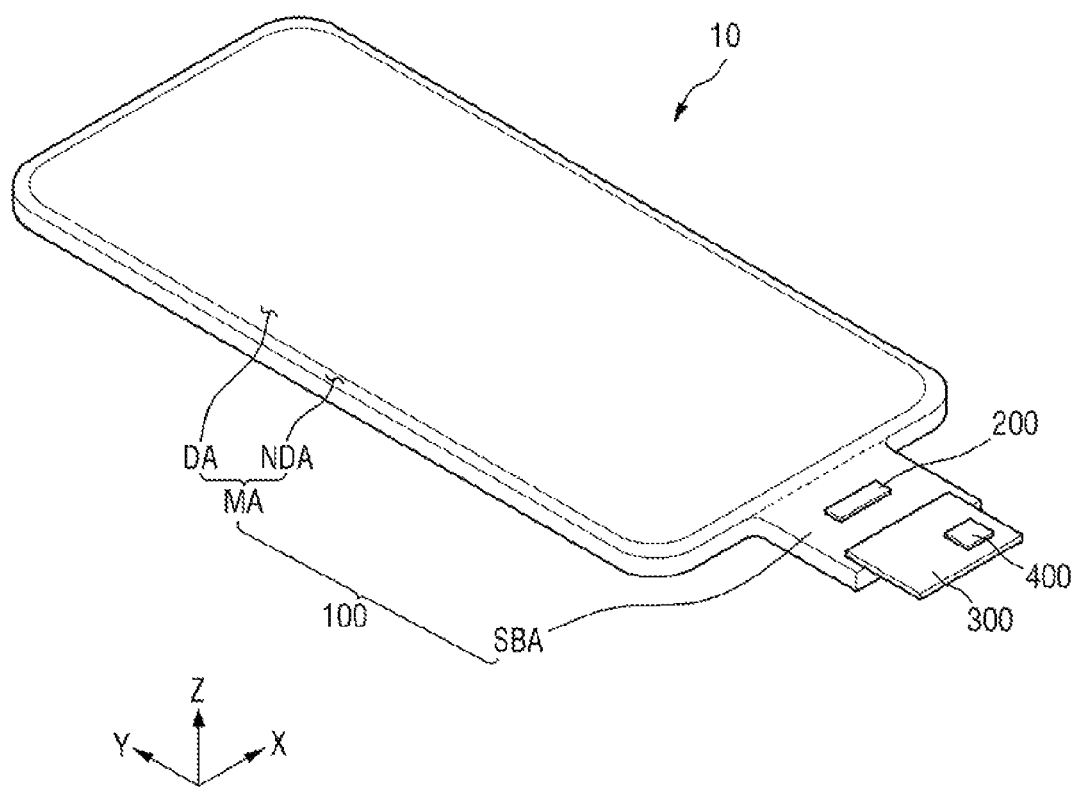
FIG. 1 is a perspective view illustrating a display device according to an embodiment of the present disclosure.

In the following description, for the purposes of explanation, numerous specific details are set forth in order to provide a thorough understanding of various embodiments or implementations of the disclosure. It is apparent, however, that various embodiments may be practiced without these specific details or with one or more equivalent arrangements. Further, various embodiments may be different and do not have to be exclusive. For example, specific shapes, configurations, and characteristics of an embodiment may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. The term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. It is also noted that, as used herein, the terms "substantially," "about," and other similar terms, are used as terms of approximation, not as terms of degree, and thus are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but may include deviations in shapes that result from, for instance, manufacturing. In this manner, regions illustrated in the drawings may be schematic in nature, and the shapes of these regions may not reflect actual shapes of regions of a device and are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules may be physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Hereinafter, detailed embodiments of the present disclosure will be described with reference to the accompanying drawings.

FIG. 1 is a perspective view illustrating a display device according to an embodiment of the present disclosure.

Referring to FIG. 1, the display device 10 may be applied to a portable electronic device such as a mobile phone, a smart phone, a tablet personal computer (PC), a mobile communication terminal, an electronic diary, an electronic book, a portable multimedia player (PMP), a navigation device, and an ultra mobile PC (UMPC). For example, the display device 10 may be applied to a television, a laptop computer, a monitor, a signboard, or a display unit of Internet of things (IoT). In another example, the display device 10 may be applied to a wearable device such as a smart watch, a watch phone, an eyeglasses-type display and a head mounted display (HMD).

The display device 10 may have a plane shape similar to a rectangular shape. For example, the display device 10 may have a plane shape similar to a rectangular shape having short sides in X-axis direction and long sides in Y-axis direction. A corner where the short side of the X-axis direction and the long side of the Y-axis direction meets may be rounded or formed at right angles to have a predetermined curvature. The plane shape of the display device 10 may be another polygonal shape, a circular shape or an oval shape without being limited to the rectangular shape.

The display device 10 may include a display panel 100, a display driver 200 (e.g., a driver circuit), a circuit board 300 and a touch driver 400 (e.g., a driver circuit).

The display panel 100 may include a main area MA and a sub-area SBA.

The main area MA may include a display area DA having pixels displaying an image and a non-display area NDA disposed near the display area DA. The display area DA may emit light from a plurality of light emission areas or a plurality of opening areas. For example, the display panel 100 may include a pixel circuit including switching elements, a pixel defining layer defining a light emission area or an opening area, and a self-light-emitting element.

For example, the self-light-emitting element may include at least one of an organic light-emitting diode including an organic light-emitting layer, a quantum dot light-emitting diode including a quantum dot light-emitting layer, an inorganic light-emitting diode including an inorganic semiconductor or a micro light-emitting diode (micro LED), but is not limited thereto.

The non-display area NDA may be an outer area of the display area DA. The non-display area NDA may be defined as an edge area of the main area MA of the display panel 100. The non-display area NDA may include a gate driver supplying gate signals to gate lines, and fan-out lines (not shown) connecting the display driver 200 with the display area DA.

The sub-area SBA may be extended from one side of the main area MA. The sub-area SBA may include a flexible material capable of bending, folding, rolling and the like. For example, when the sub-area SBA is bent, the sub-area SBA may overlap the main area MA in a thickness direction (Z-axis direction). The sub-area SBA may include a display driver 200 and a pad area connected to the circuit board 300. Optionally, the sub-area SBA may be omitted, and the display driver 200 and the pad area may be disposed in the non-display area NDA.

The display driver 200 may output signals and voltages for driving the display panel 100. The display driver 200 may supply data voltages to data lines. The display driver 200 may supply a power voltage to a power line and supply a gate control signal to the gate driver. The display driver 200 may include an integrated circuit (IC), and may be packaged on the display panel 100 by a chip on glass (COG) method, a chip on plastic (COP) method or an ultrasonic bonding method. For example, the display driver 200 may be disposed in the sub-area SBA, and may overlap the main area MA in the thickness direction (Z-axis direction) by bending of the sub-area SBA. In another example, the display driver 200 may be packaged on the circuit board 300.

The circuit board 300 may be attached onto the pad area of the display panel 100 using an anisotropic conductive film (ACF). Lead lines of the circuit board 300 may electrically be connected to the pad area of the display panel 100. The circuit board 300 may be a flexible printed circuit board, a printed circuit board or a flexible film such as a chip on film.

The touch driver 400 may be packaged on the circuit board 300. The touch driver 400 may be connected to a touch sensing unit of the display panel 100. The touch driver 400 may supply a touch driving signal to a plurality of touch electrodes of the touch sensing unit, and may sense a change amount in capacitance between the plurality of touch electrodes. For example, the touch driving signal may be a pulse signal having a predetermined frequency. The touch driver 400 may calculate input coordinates based on the change amount in capacitance between the plurality of touch electrodes. The touch driver 400 may include an integrated circuit (IC).

Figure 2:
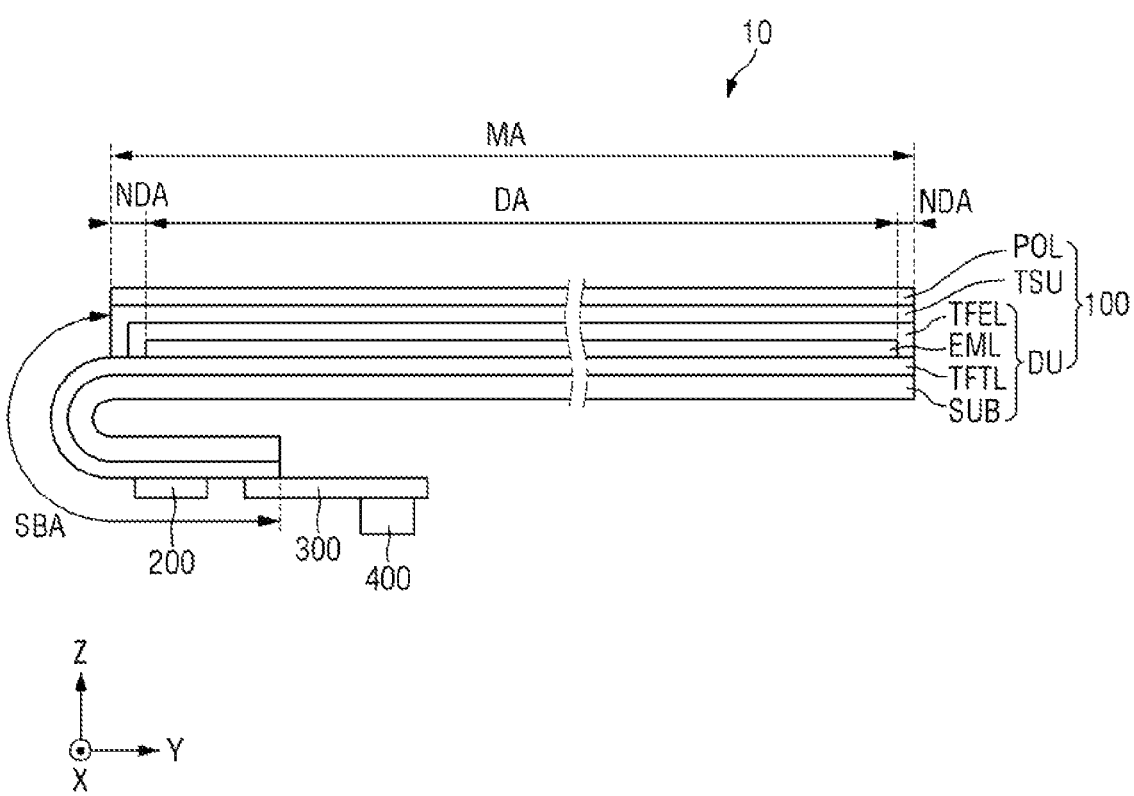
FIG. 2 is a cross-sectional view illustrating a display device according to an embodiment of the present disclosure.

FIG. 2 is a cross-sectional view illustrating a display device according to an embodiment of the present disclosure.

Referring to FIG. 2, the display panel 100 may include a display unit DU (e.g., a display film), a touch sensing unit TSU (e.g., a touch layer) and a polarizing film POL. The display unit DU may include a substrate SUB, a thin film transistor layer TFTL, a light-emitting element layer EML, and an encapsulation layer TFEL.

The substrate SUB may be a base substrate or a base member. The substrate SUB may be a flexible substrate SUB capable of bending, folding, rolling and the like. For example, the substrate SUB may include a glass material or a metal material, but is not limited thereto. In another example, the substrate SUB may include a polymer resin such as polyimide (PI).

The thin film transistor layer TFTL may be disposed on the substrate SUB. The thin film transistor layer TFTL may include a plurality of thin film transistors constituting a pixel circuit of pixels. The thin film transistor layer TFTL may further include gate lines, data lines, power lines, gate control lines, fan-out lines connecting the display driver 200 with the data lines, and lead lines connecting the display driver 200 with the pad area. Each of the thin film transistors may include a semiconductor area, a source electrode, a drain electrode and a gate electrode. For example, when the gate driver is formed on one side of the non-display area NDA of the display panel 100, the gate driver may include thin film transistors.

The thin film transistor layer TFTL may be disposed in the display area DA, the non-display area NDA and the sub-area SBA. The thin film transistors of each of pixels of the thin film transistor layer TFTL, the gate lines, the data lines and the power lines may be disposed in the display area DA. The gate control lines and fan out lines of the thin film transistor layer TFTL may be disposed in the non-display area NDA. The lead lines of the thin film transistor layer TFTL may be disposed in the sub-area SBA.

The light-emitting element layer EML may be disposed on the thin film transistor layer TFTL. The light-emitting element layer EML may include a plurality of light-emitting elements that include a first electrode, a light-emitting layer and a second electrode, which are sequentially deposited to emit light, and a pixel defining layer that defines pixels. The plurality of light-emitting elements of the light-emitting element layer EML may be disposed in the display area DA.

For example, the light-emitting layer may be an organic light-emitting layer that includes an organic material. The light-emitting layer may include a hole transporting layer, an organic light-emitting layer, and an electron transporting layer. When the first electrode receives a predetermined voltage through the thin film transistor of the thin film transistor layer TFTL and the second electrode receives a cathode voltage, holes and electrons may move to the organic light-emitting layer through the hole transporting layer and the electron transporting layer, respectively, and may be coupled to each other in the organic light-emitting layer to emit light. For example, the first electrode may be an anode electrode and the second electrode may be a cathode electrode, but they are not limited thereto.

In another example, the plurality of light-emitting elements may include a quantum dot light-emitting diode including a quantum dot light-emitting layer, an inorganic light-emitting diode including an inorganic semiconductor, or a micro light-emitting diode.

The encapsulation layer TFEL may cover an upper surface and a side of the light-emitting element layer EML and protect the light-emitting element layer EML. The encapsulation layer TFEL may include at least one inorganic layer and at least one organic layer to encapsulate the light-emitting element layer EML.

The touch sensing unit TSU may be disposed on the encapsulation layer TFEL. The touch sensing unit TSU may include a plurality of touch electrodes for sensing a user's touch in a capacitance manner and touch lines for connecting the plurality of touch electrodes with the touch driver 400. For example, the touch sensing unit TSU may sense a user's touch in a mutual capacitance type or a self-capacitance type.

In another example, the touch sensing unit TSU may be disposed on a separate substrate disposed on the display unit DU. In this case, the substrate for supporting the touch sensing unit TSU may be a base member for encapsulating the display unit DU.

A plurality of touch electrodes of the touch sensing unit TSU may be disposed in a touch sensor area overlapped with the display area DA. The touch lines of the touch sensing unit TSU may be disposed in a touch peripheral area overlapped with the non-display area NDA.

The polarizing film POL may be disposed on the touch sensing unit TSU. The polarizing film POL may be attached onto the touch sensing unit TSU by an optically clear adhesive (OCA) film or an optically clear resin (OCR). For example, the polarizing film POL may include a linear polarizing plate and a phase delay film such as a λ/4 plate (quarter-wave plate). The phase delay film and the linear polarizing plate may be sequentially deposited on the touch sensing unit TSU.

The sub-area SBA of the display panel 100 may be extended from one side of the main area MA. The sub-area SBA may include a flexible material capable of bending, folding, rolling and the like. For example, when the sub-area SBA is bent, the sub-area SBA may overlap the main area MA in the thickness direction (Z-axis direction). The sub-area SBA may include a display driver 200 and a pad area connected to the circuit board 300.

Figure 3:
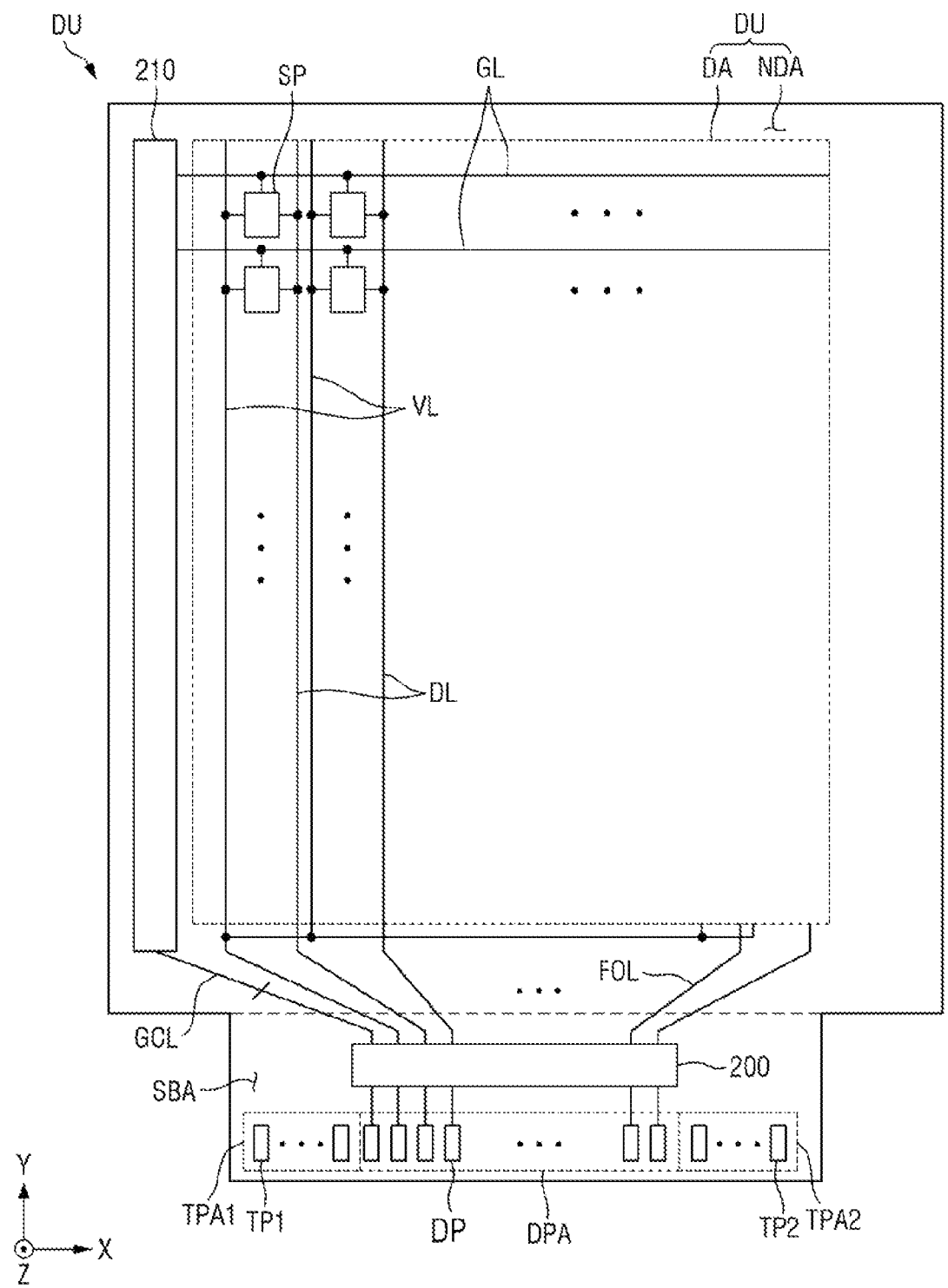
FIG. 3 is a plan view illustrating a display unit of a display device according to an embodiment of the present disclosure.

FIG. 3 is a plan view illustrating a display unit of a display device according to an embodiment of the present disclosure.

Referring to FIG. 3, the display unit DU may include a display area DA and a non-display area NDA.

The display area DA is an area for displaying an image, and may be defined as a central area of the display panel 100. The display area DA may include a plurality of pixels SP, a plurality of gate lines GL, a plurality of data lines DL and a plurality of power lines VL. Each of the plurality of pixels SP may be defined as a minimum unit for outputting light.

The plurality of gate lines GL may supply gate signals received from the gate driver 210 to the plurality of pixels SP. The plurality of gate lines GL may be extended in the X-axis direction, and may be spaced apart from each other in the Y-axis direction crossing the X-axis direction.

The plurality of data lines DL may supply data voltages received from the display driver 200 to the plurality of pixels SP. The plurality of data lines DL may be extended in the Y-axis direction, and may be spaced apart from each other in the X-axis direction.

The plurality of power lines VL may supply the power voltage received from the display driver 200 to the plurality of pixels SP. The power voltage may be at least one of a driving voltage, an initialization voltage or a reference voltage. The plurality of power lines VL may be extended in the Y-axis direction, and may be spaced apart from each other in the X-axis direction.

The non-display area NDA may surround the display area DA. The non-display area NDA may include a gate driver 210, fan-out lines FOL and gate control lines GCL. The gate driver 210 may generate a plurality of gate signals based on the gate control signals GCL, and may sequentially supply the plurality of gate signals to the plurality of gate lines GL in accordance with a predetermined order.

The fan-out lines FOL may extend from the display driver 200 to the display area DA. The fan-out lines FOL may supply the data voltages received from the display driver 200 to the plurality of data lines DL.

The gate control lines GCL may extend from the display driver 200 to the gate driver 210. The gate control lines GCL may supply the gate control signals received from the display driver 200 to the gate driver 210.

The sub-area SBA may include a display driver 200, a display pad area DPA, and first and second touch pad areas TPA1 and TPA2.

The display driver 200 may output signals and voltages for driving the display panel 100 to the fan-out lines FOL.

The display driver 200 may supply the data voltages to the data lines DL through the fan-out lines FOL. The data voltages may be supplied to the plurality of pixels SP, and may determine luminance of the plurality of pixels SP. The display driver 200 may supply the gate control signals to the gate driver 210 through the gate control line GCL.

The display pad area DPA, the first touch pad area TPA1 and the second touch pad area TPA2 may be disposed at the edge of the sub-area SBA. The display pad area DPA, the first touch pad area TPA1 and the second touch pad area TPA2 may be electrically connected to the circuit board 300 using a low resistance high reliability material such as an anisotropic conductive film or a self-assembly anisotropic conductive paste (SAP).

The display pad area DPA may include a plurality of display pad areas DP. The plurality of display pad areas DP may be connected to a graphic system through the circuit board 300. The plurality of display pad areas DP may be connected to the circuit board 300 to receive digital video data, and may supply the digital video data to the display driver 200.

Figure 4:
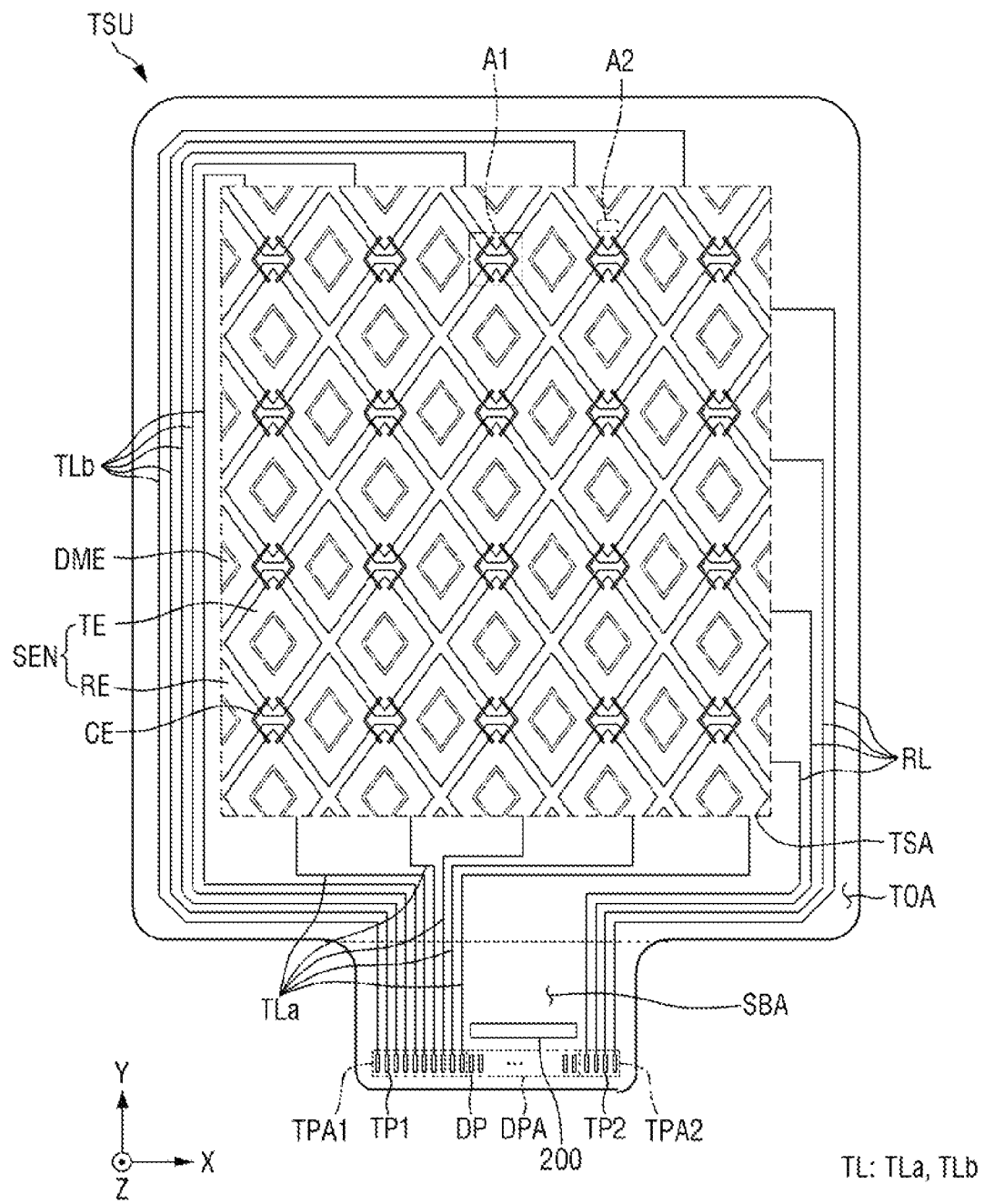
FIG. 4 is a plan view illustrating a touch sensing unit of a display device according to an embodiment of the present disclosure.

FIG. 4 is a plan view illustrating a touch sensing unit of a display device according to an embodiment of the present disclosure.

Referring to FIG. 4, the touch sensing unit TSU may include a touch sensor area TSA for sensing a user's touch and a touch peripheral area TOA disposed near the touch sensor area TSA. The touch sensor area TSA may overlap the display area DA of the display unit DU, and the touch peripheral area TOA may overlap the non-display area NDA of the display unit DU.

The touch sensor area TSA may include a plurality of touch electrodes SEN and a plurality of dummy electrodes DME. The plurality of touch electrodes SEN may form mutual capacitance or magnetic capacitance to sense an object or a touch of a person. The plurality of touch electrodes SEN may include a plurality of driving electrodes TE and a plurality of sensing electrodes RE.

The plurality of driving electrodes TE may be arranged in the X-axis direction and the Y-axis direction. The plurality of driving electrodes TE may be spaced apart from each other in the X-axis direction and the Y-axis direction. The driving electrodes TE adjacent to each other in the Y-axis direction may be electrically connected to each other through a bridge electrode CE.

The plurality of driving electrodes TE may be connected to a first touch pad TP1 through a driving line TL. The driving line TL may include a lower driving line TLa and an upper driving line TLb. For example, the driving electrodes TE disposed on a lower side of the touch sensor area TSA may be connected to the first touch pad TP1 through the lower driving line TLa, and the driving electrodes TE disposed above the touch sensor area TSA may be connected to the first touch pad TP1 through the upper driving line TLb. The lower driving line TLa may extend from a lower side of the touch peripheral area TOA to the first touch pad TP1. The upper driving line TLb may extend to the first touch pad TP1 via upper, left and lower sides of the touch peripheral area TOA. The first touch pad TP1 may be connected to the touch driver 400 through the circuit board 300.

The bridge electrode CE may be bent at least once. For example, the bridge electrode CE may have a bent shape ("<" or ">"), but its plane shape is not limited thereto. The driving electrodes TE adjacent to each other in the Y-axis direction may be connected by a plurality of bridge electrodes CE, and even though one of the bridge electrodes CE is disconnected, the driving electrodes TE may stably be connected through the other bridge electrodes CE. The adjacent driving electrodes TE may be connected by two bridge electrodes CE, but the number of the bridge electrodes CE is not limited thereto.

The bridge electrode CE may be disposed in a layer different from the plurality of driving electrodes TE and the plurality of sensing electrodes RE. The sensing electrodes RE adjacent to each other in the X-axis direction may electrically be connected through a connection portion disposed in the same layer as the plurality of driving electrodes TE or the plurality of sensing electrodes RE. The driving electrodes TE adjacent to each other in the Y-axis direction may electrically be connected through the bridge electrode CE disposed in a layer different from the plurality of driving electrodes TE or the plurality of sensing electrodes RE. Therefore, even though the bridge electrode CE overlaps the plurality of sensing electrodes RE in the Z-axis direction, the plurality of driving electrodes TE may be insulated from the plurality of sensing electrodes RE. Mutual capacitance may be formed between the driving electrode TE and the sensing electrode RE.

The plurality of sensing electrodes RE may extend in the X-axis direction, and may be spaced apart from each other in the Y-axis direction. The plurality of sensing electrodes RE may be arranged in the X-axis direction and the Y-axis direction, and the sensing electrodes RE adjacent to each other in the X-axis direction may electrically connected with each other through the connection portion.

The plurality of sensing electrodes RE may be connected to a second touch pad TP2 through a sensing line RL. For example, the sensing electrodes RE disposed on a right side of the touch sensor area TSA may be connected to the second touch pad TP2 through the sensing line RL. The sensing line RL may extend to the second touch pad TP2 via right and lower sides of the touch peripheral area TOA. The second touch pad TP2 may be connected to the touch driver 400 through the circuit board 300.

Each of the plurality of dummy electrodes DME may be surrounded by the driving electrode TE or the sensing electrode RE. Each of the plurality of dummy electrodes DME may be spaced apart from the driving electrode TE or the sensing electrode RE and then insulated therefrom. Therefore, the dummy electrode DME may be electrically floated.

The display pad area DPA, the first touch pad area TPA1 and the second touch pad area TPA2 may be disposed at the edge of the sub-area SBA. The display pad area DPA, the first touch pad area TPA1 and the second touch pad area TPA2 may electrically be connected to the circuit board 300 using a low resistance high reliability material such as an anisotropic conductive film or a self-assembly anisotropic conductive paste (SAP).

The first touch pad area TPA1 may be disposed on a first side of the display pad area DPA, and may include a plurality of first touch pad areas TP1. The plurality of first touch pad areas TP1 may electrically be connected to the touch driver 400 disposed on the circuit board 300. The plurality of first touch pad areas TP1 may supply the touch driving signal to the plurality of driving electrodes TE through the plurality of driving lines TL.

The second touch pad area TPA2 may be disposed on a second side of the display pad area DPA different from the first side, and may include a plurality of second touch pad areas TP2. The plurality of second touch pad areas TP2 may be electrically connected to the touch driver 400 disposed on the circuit board 300. The touch driver 400 may receive a touch sensing signal through the plurality of sensing lines RL connected to the plurality of second touch pad areas TP2, and may sense a mutual capacitance change between the driving electrode TE and the sensing electrode RE.

In another example, the touch driver 400 may supply the touch driving signal to each of the plurality of driving electrodes TE and the plurality of sensing electrodes RE, and may receive the touch sensing signal from each of the plurality of driving electrodes TE and the plurality of sensing electrodes RE. The touch driver 400 may sense a charge change amount of each of the plurality of driving electrodes TE and the plurality of sensing electrodes RE based on the touch sensing signal.

Figure 5:
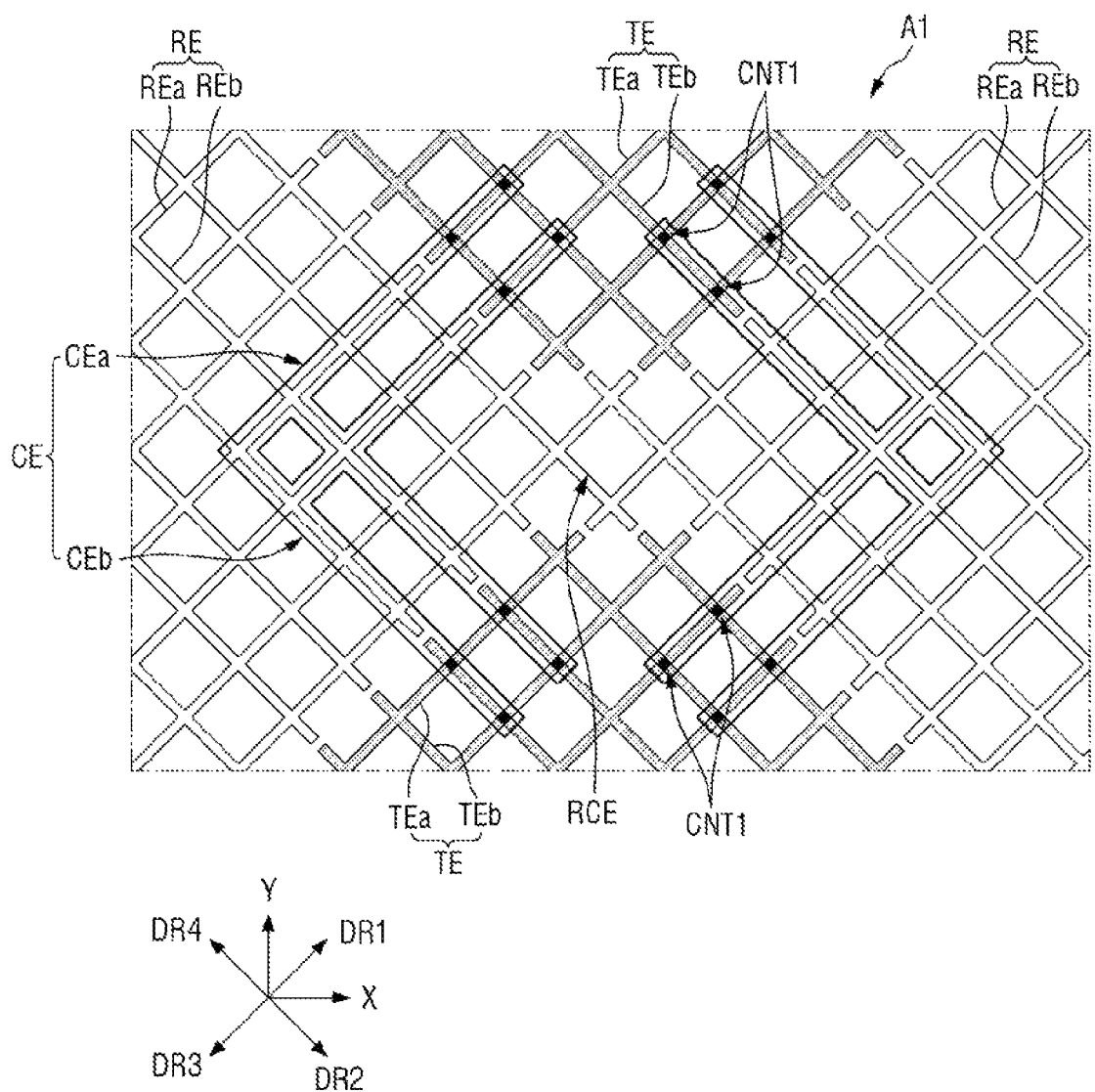
FIG. 5 is an enlarged view illustrating a touch sensing unit of an area A1 of FIG. 4.
Figure 6:
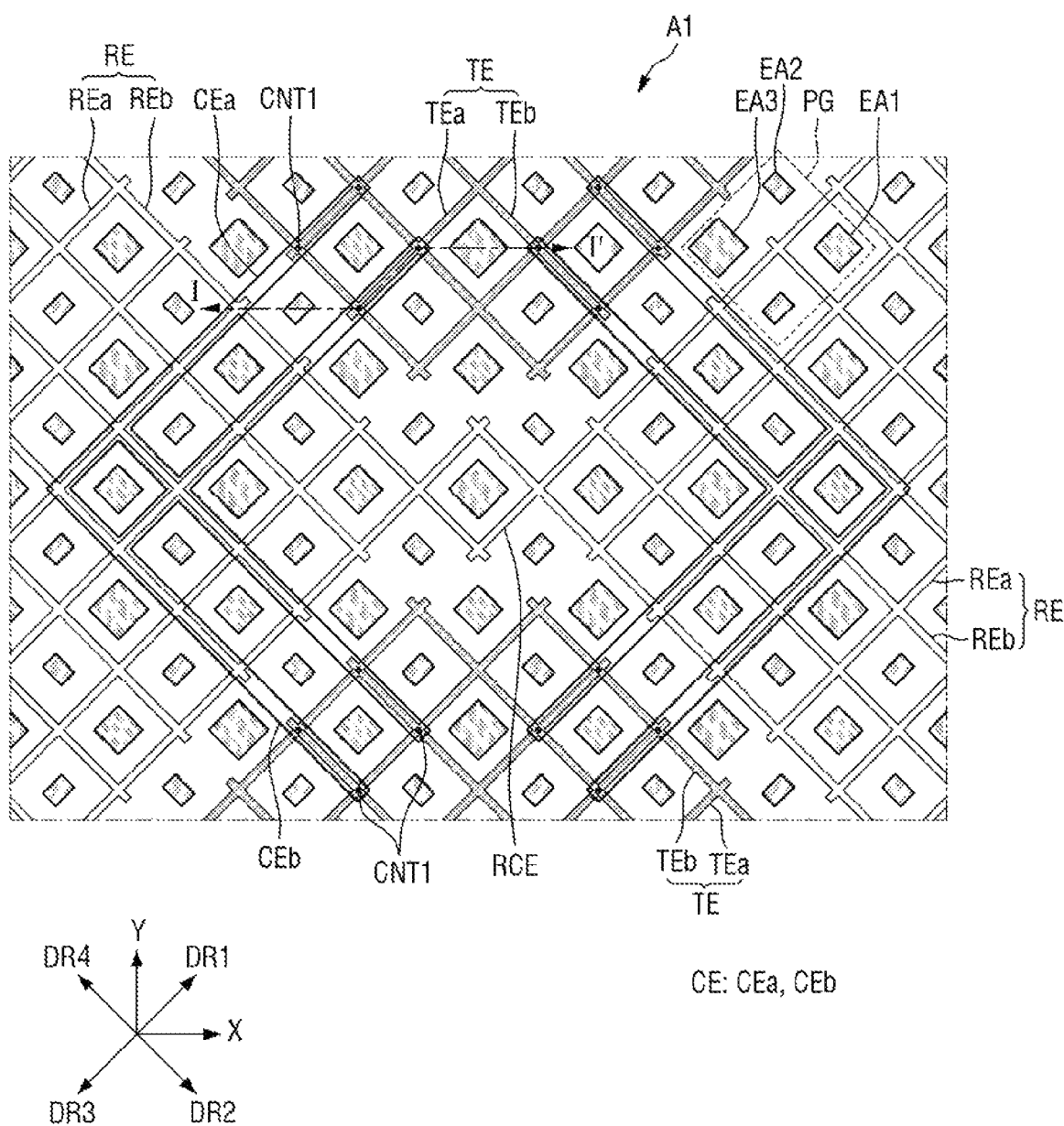
FIG. 6 is an enlarged view illustrating a portion of a display device according to an embodiment of the present disclosure.

FIG. 5 is an enlarged view illustrating a touch sensing unit of an area A1 of FIG. 4, and FIG. 6 is an enlarged view illustrating a portion of a display device according to an embodiment of the present disclosure.

Referring to FIGS. 5 and 6, the plurality of driving electrodes TE, the plurality of sensing electrodes RE and the plurality of dummy electrodes DME may be disposed in the same layer, and may be spaced apart from one another.

The plurality of driving electrodes TE may be arranged in the X-axis direction and the Y-axis direction. The plurality of driving electrodes TE may be spaced apart from each other in the X-axis direction and the Y-axis direction. The driving electrodes TE adjacent to each other in the Y-axis direction may electrically be connected to each other through the bridge electrode CE.

The plurality of sensing electrodes RE may extend in the X-axis direction, and may be spaced apart from each other in the Y-axis direction. The plurality of sensing electrodes RE may be arranged in the X-axis direction and the Y-axis direction, and the sensing electrodes RE adjacent to each other in the X-axis direction may be electrically connected to each other through a connection portion RCE. For example, the connection portion RCE of the sensing electrodes RE may be disposed within a shortest distance of the driving electrodes TE adjacent to each other.

The plurality of bridge electrodes CE may be disposed in a layer different from the driving electrode TE and the sensing electrode RE. The bridge electrode CE may include a first portion CEa and a second portion CEb. For example, the first portion CEa of the bridge electrode CE may be connected to the driving electrode TE disposed on one side through a first contact hole CNT1 and extend in a third direction DR3. The second portion CEb of the bridge electrode CE may extend in a second direction DR2 by being bent from the first portion CEa in an area overlapped with the sensing electrode RE, and may be connected to the driving electrode TE disposed on the other side through the first contact hole CNT1. Hereinafter, a first direction DR1 may be a direction between the X-axis direction and the Y-axis direction, the second direction DR2 may be a direction between an opposite direction of the Y-axis and the X-axis direction, the third direction DR3 may be an opposite direction of the first direction DR1, and a fourth direction DR4 may be an opposite direction of the second direction DR2. Therefore, each of the plurality of bridge electrodes CE may connect the driving electrodes TE adjacent to each other in the Y-axis direction with each other.

For example, the plurality of driving electrodes TE, the plurality of sensing electrodes RE and the plurality of dummy electrodes DME may be arranged in a planar mesh structure or a netted structure. The plurality of driving electrodes TE, the plurality of sensing electrodes RE and the plurality of dummy electrodes DME may surround each of first to third light emission areas EA1, EA2 and EA3 of a pixel group PG on a plane. Therefore, the plurality of driving electrodes TE, the plurality of sensing electrodes RE and the plurality of dummy electrodes DME may not overlap the first to third light emission areas EA1, EA2 and EA3. The plurality of bridge electrodes CE may not overlap the first to third light emission areas EA1, EA2 and EA3, either. Therefore, the display device 10 may prevent luminance of light emitted from the first to third light emission areas EA1, EA2 and EA3 from being reduced by the touch sensing unit TSU.

Each of the plurality of driving electrodes TE may include a first portion TEa that extends in the first direction DR1 and a second portion TEb that extends in the second direction DR2. Each of the plurality of sensing electrodes RE may include a first portion REa that extends in the first direction DR1 and a second portion REb that extends in the second direction DR2.

The plurality of pixels may include first to third subpixels, and each of the first to third subpixels may include the first to third light emission areas EA1, EA2 and EA3. For example, the first light emission area EA1 may emit light of a first color or red light, the second light emission area EA2 may emit light of a second color or a green light, and the third light emission area EA3 may emit light of a third color or blue light, but these light emission areas are not limited thereto. For example, the light emission areas may emit light of color different from red, green, and blue.

One pixel group PG may include one first light emission area EA1, two second light emission areas EA2 and one third light emission area EA3 to express a white gray scale, but its configuration is not limited thereto. The white gray scale may be expressed by combination of light emitted from one first light emission area EA1, light emitted from two second light emission areas EA2 and light emitted from one third light emission area EA3.

Figure 7:
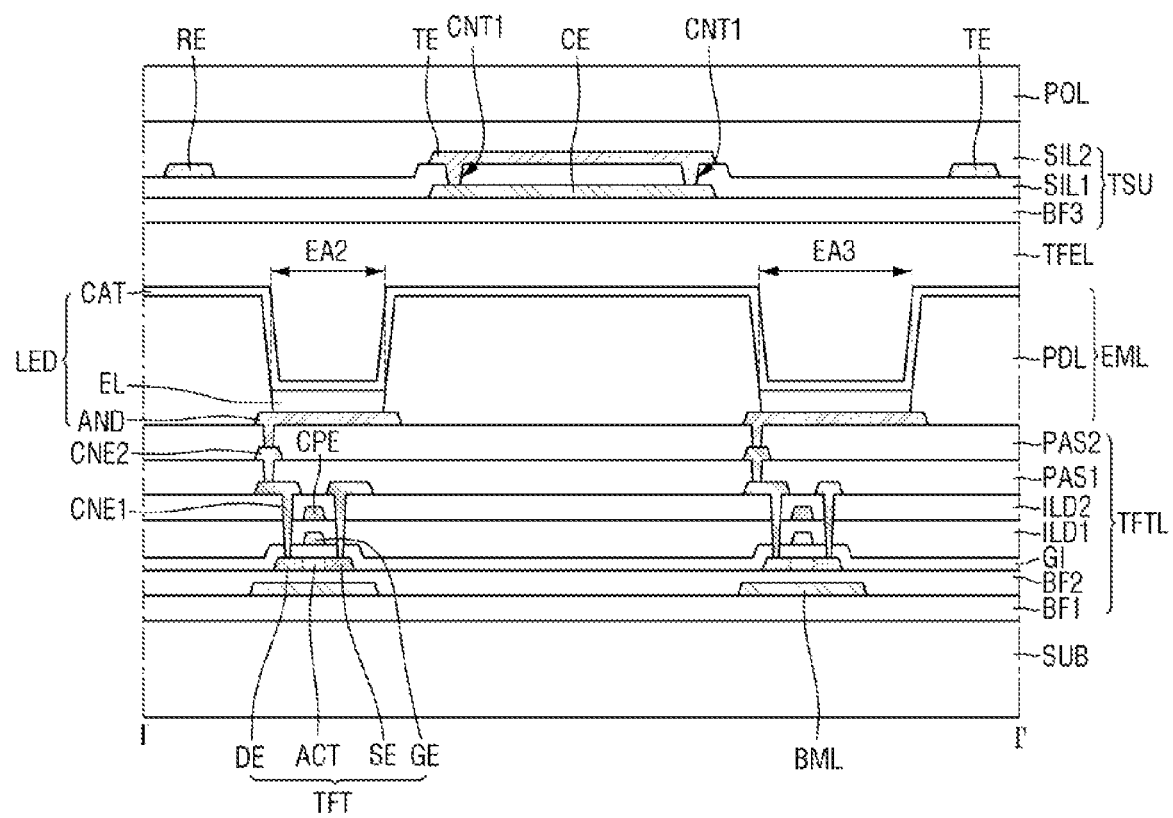
FIG. 7 is a cross-sectional view taken along line I-I' of FIG. 6.

FIG. 7 is a cross-sectional view taken along line I-I' of FIG. 6.

Referring to FIG. 7, the display panel 100 may include a display unit DU, a touch sensing unit TSU and a polarizing film POL. The display unit DU may include a substrate SUB, a thin film transistor layer TFTL, a light-emitting element layer EML, and an encapsulation layer TFEL.

The substrate SUB may be a base substrate or a base member. The substrate SUB may be a flexible substrate SUB capable of bending, folding, rolling and the like. For example, the substrate SUB may include a glass material or a metal material, but is not limited thereto. In another example, the substrate SUB may include a polymer resin such as polyimide (PI).

The thin film transistor layer TFTL may include a first buffer layer BF1, a light-shielding layer BML, a second buffer layer BF2, a thin film transistor TFT, a gate insulating layer GI, a first interlayer dielectric layer ILD1, a capacitor electrode CPE, a second interlayer dielectric layer ILD2, a first connection electrode CNE1, a first passivation layer PAS1, a second connection electrode CNE2, and a second passivation layer PAS2.

The first buffer layer BF1 may be disposed on the substrate SUB. The first buffer layer BF1 may include an inorganic layer capable of preventing air or moisture from being permeated thereinto. For example, the first buffer layer BF1 may include a plurality of inorganic layers that are alternately deposited.

The light-shielding layer BML may be disposed on the first buffer layer BF1. For example, the light-shielding layer BML may be formed of a single layer or multiple layers made of one of molybdenum (Mo), aluminum (Al), chromium (Cr), gold (Au), titanium (Ti), nickel (Ni), neodymium (Nd) and copper (Cu) or their alloy. In another example, the light-shielding layer BML may be an organic layer that includes a black pigment.

The second buffer layer BF2 may cover the first buffer layer BF1 and the light-shielding layer BML. The second buffer layer BF2 may include an inorganic layer capable of preventing permeation of the air or moisture from occurring. For example, the second buffer layer BF2 may include a plurality of inorganic layers that are alternately deposited.

The thin film transistor TFT may be disposed on the second buffer layer BF2, and may constitute the pixel circuit of each of the plurality of pixels. For example, the thin film transistor TFT may be a driving transistor or a switching transistor of the pixel circuit. The thin film transistor TFT may include a semiconductor area ACT, a source electrode SE, a drain electrode DE and a gate electrode GE.

The semiconductor area ACT, the source electrode SE and the drain electrode DE may be disposed on the second buffer layer BF2. The semiconductor area ACT, the source electrode SE and the drain electrode DE may overlap the light-shielding layer BML in the thickness direction. The semiconductor area ACT may overlap the gate electrode GE in the thickness direction, and may be insulated from the gate electrode GE by the gate insulating layer GI. The source electrode SE and the drain electrode DE may be provided by conductorizing of a material of the semiconductor area ACT.

The gate electrode GE may be disposed on the gate insulating layer GI. The gate electrode GE may overlap the semiconductor area ACT with the gate insulating layer GI interposed therebetween.

The gate insulating layer GI may be disposed on the semiconductor area ACT, the source electrode SE and the drain electrode DE. For example, the gate insulating layer GI may cover the semiconductor area ACT, the source electrode SE, the drain electrode DE and the second buffer layer BF2, and may insulate the semiconductor area ACT from the gate electrode GE. The gate insulating layer GI may include a contact hole through which the first connection electrode CNE1 passes.

The first interlayer dielectric layer ILD1 may cover the gate electrode GE and the gate insulating layer GI. The first interlayer dielectric layer ILD1 may include a contact hole through which the first connection electrode CNE1 passes. The contact hole of the first interlayer dielectric layer ILD1 may be connected to a contact hole of the gate insulating layer GI and a contact hole of the second interlayer dielectric layer ILD2.

The capacitor electrode CPE may be disposed on the first interlayer dielectric layer ILD1. The capacitor electrode CPE may overlap the gate electrode GE in the thickness direction. A capacitance may form between the capacitor electrode CPE and the gate electrode GE.

The second interlayer dielectric layer ILD2 may cover the capacitor electrode CPE and the first interlayer dielectric layer ILD1. The second interlayer dielectric layer ILD2 may include a contact hole through which the first connection electrode CNE1 passes. The contact hole of the second interlayer dielectric layer ILD2 may be connected to the contact hole of the first interlayer dielectric layer ILD1 and the contact hole of the gate insulating layer GI.

The first connection electrode CNE1 may be disposed on the second interlayer dielectric layer ILD2. The first connection electrode CNE1 may connect the drain electrode DE of the thin film transistor TFT with the second connection electrode CNE2. The first connection electrode CNE1 may be inserted into the contact holes provided in the second interlayer dielectric layer ILD2, the first interlayer dielectric layer ILD1 and the gate insulating layer GI, and then may be in contact with the drain electrode DE of the thin film transistor TFT.

The first passivation layer PAS1 may cover the first connection electrode CNE1 and the second interlayer dielectric layer ILD2. The first passivation layer PAS1 may protect the thin film transistor TFT. The first passivation layer PAS1 may include a contact hole through which the second connection electrode CNE2 passes.

The second connection electrode CNE2 may be disposed on the first passivation layer PAS1. The second connection electrode CNE2 may connect the first connection electrode CNE1 with a pixel electrode AND of the light-emitting element LED. The second connection electrode CNE2 may be inserted into the contact hole provided in the first passivation layer PAS1, and then may be in contact with the first connection electrode CNE1.

The second passivation layer PAS2 may cover the second connection electrode CNE2 and the first passivation layer PAS1. The second passivation layer PAS2 may include a contact hole through which the pixel electrode AND of the light-emitting element LED passes.

The light-emitting element layer EML may be disposed on the thin film transistor layer TFTL. The light-emitting element layer EML may include a light-emitting element LED and a pixel defining layer PDL. The light-emitting element LED may include a pixel electrode AND, a light-emitting layer EL, and a common electrode CAT.

The pixel electrode AND may be disposed on the second passivation layer PAS2. The pixel electrode AND may be disposed to overlap one of the first to third light emission areas EA1, EA2 and EA3 defined by the pixel defining layer PDL. The pixel electrode AND may be connected to the drain electrode DE of the thin film transistor TFT through the first and second connection electrodes CNE1 and CNE2.

The light-emitting layer EL may be disposed on the pixel electrode AND. For example, the light-emitting layer EL may be an organic light-emitting layer made of an organic material, but is not limited thereto. When the light-emitting layer EL corresponds to the organic light-emitting layer, the thin film transistor TFT applies a predetermined voltage to the pixel electrode AND of the light-emitting element LED. When the common electrode CAT of the light-emitting element LED receives a common voltage or a cathode voltage, the holes and electrons may move to the light-emitting layer EL through the hole transporting layer and the electron transporting layer, and the holes and electrons may be combined with each other in the light-emitting layer EL to emit light.

The common electrode CAT may be disposed on the light-emitting layer EL. For example, the common electrode CAT may be implemented in the form of an electrode that is not divided per pixel and is common to all of the pixels. The common electrode CAT may be disposed on the light-emitting layer EL in the first to third light emission areas EA1, EA2 and EA3, and may be disposed on the pixel defining layer PDL in an area except the first to third light emission areas EA1, EA2 and EA3.

The common electrode CAT may receive a common voltage or a low potential voltage. When the pixel electrode AND receives a voltage corresponding to the data voltage and the common electrode CAT receives the low potential voltage, a potential difference may be formed between the pixel electrode AND and the common electrode CAT so that the light-emitting layer EL may emit light.

The pixel defining layer PDL may define the first to third light emission areas EA1, EA2 and EA3. The pixel defining layer PDL may separate and insulate the pixel electrodes AND of the plurality of light-emitting elements LED from each other.

The encapsulation layer TFEL may be disposed on the common electrode CAT to cover the plurality of light-emitting elements LEDs. The encapsulation layer TFEL may include at least one inorganic layer to prevent oxygen or moisture from being permeated into the light-emitting element layer EML. The encapsulation layer TFEL may include at least one organic layer to protect the light-emitting element layer EML from particles such as dust.

The touch sensing unit TSU may be disposed on the encapsulation layer TFEL. The touch sensing unit TSU may include a third buffer layer BF3, a bridge electrode CE, a first insulating layer SIL1 a driving electrode TE, a sensing electrode RE, and a second insulating layer SIL2.

The third buffer layer BF3 may be disposed on the encapsulation layer TFEL. The third buffer layer BF3 may have insulation and optical functions. The third buffer layer BF3 may include at least one inorganic layer. Optionally, the third buffer layer BF3 may be omitted.

The bridge electrode CE may be disposed on the third buffer layer BF3. The bridge electrode CE may be disposed in a layer different from the driving electrode TE and the sensing electrode RE to connect driving electrodes TE adjacent to each other in the Y-axis direction.

The first insulating layer SIL1 may cover the bridge electrode CE and the third buffer layer BF3. The first insulating layer SIL1 may have insulating and optical functions. For example, the first insulating layer SIL1 may be an inorganic layer that includes at least one of a silicon nitride layer, a silicon oxynitride layer, a silicon oxide layer, a titanium oxide layer or an aluminum oxide layer.

The driving electrode TE and the sensing electrode RE may be disposed on the first insulating layer SIL1 In an embodiment, each of the driving electrode TE and the sensing electrode RE do not overlap the first to third light emission areas EA1, EA2 and EA3. Each of the driving electrode TE and the sensing electrode RE may be formed of a single layer of molybdenum (Mo), titanium (Ti), copper (Cu), aluminum (Al) or indium tin oxide (ITO), or a deposited structure of aluminum and titanium (Ti/Al/Ti), a deposited structure of aluminum and ITO (ITO/Al/ITO), an APC alloy and a deposited structure of APC alloy and ITO (ITO/APC alloy/ITO).

The second insulating layer SIL2 may cover the driving electrode TE, the sensing electrode RE and the first insulating layer SIL1 The second insulating layer SIL2 may have insulation and optical functions. The second insulating layer SIL2 may be formed of a same material as the first insulating layer SIL1

The polarizing film POL may be disposed on the touch sensing unit TSU. The polarizing film POL may be attached onto the touch sensing unit TSU by an optically clear adhesive (OCA) film or an optically clear resin (OCR). For example, the polarizing film POL may include a linear polarizing plate and a phase delay film such as a λ/4 plate (quarter-wave plate). The phase delay film and the line polarizing plate may be sequentially deposited on the touch sensing unit TSU.

Figure 8:
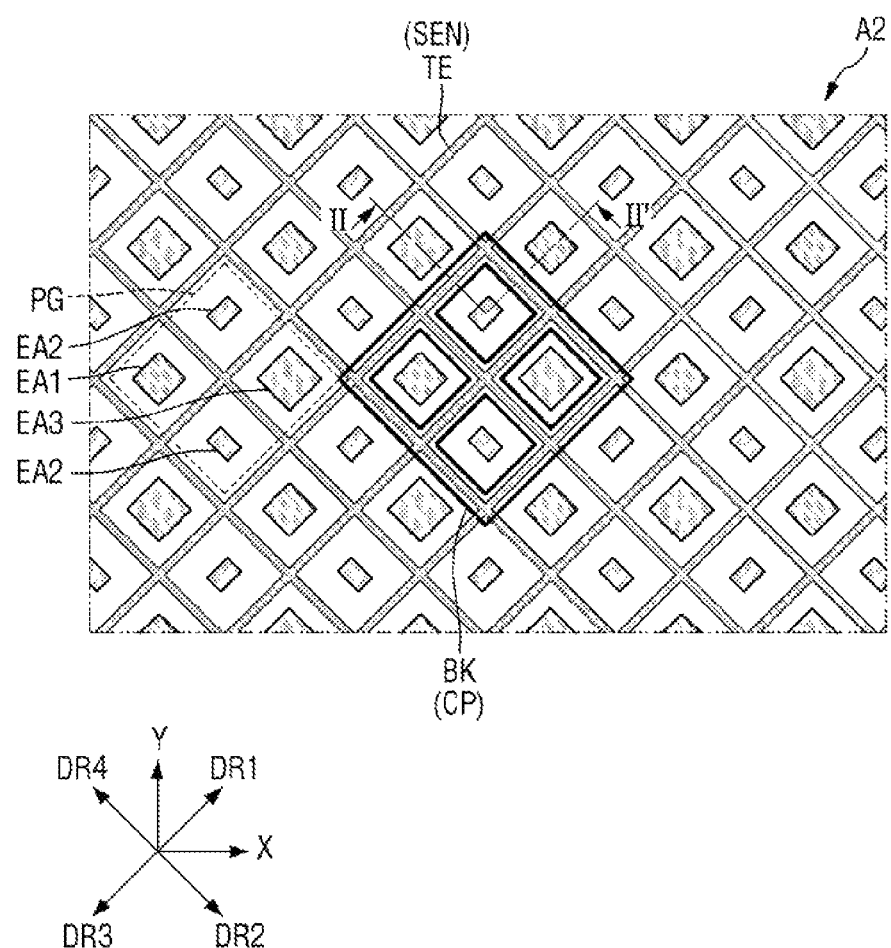
FIG. 8 is an enlarged view illustrating an example of an area A2 of FIG. 4.
Figure 9:
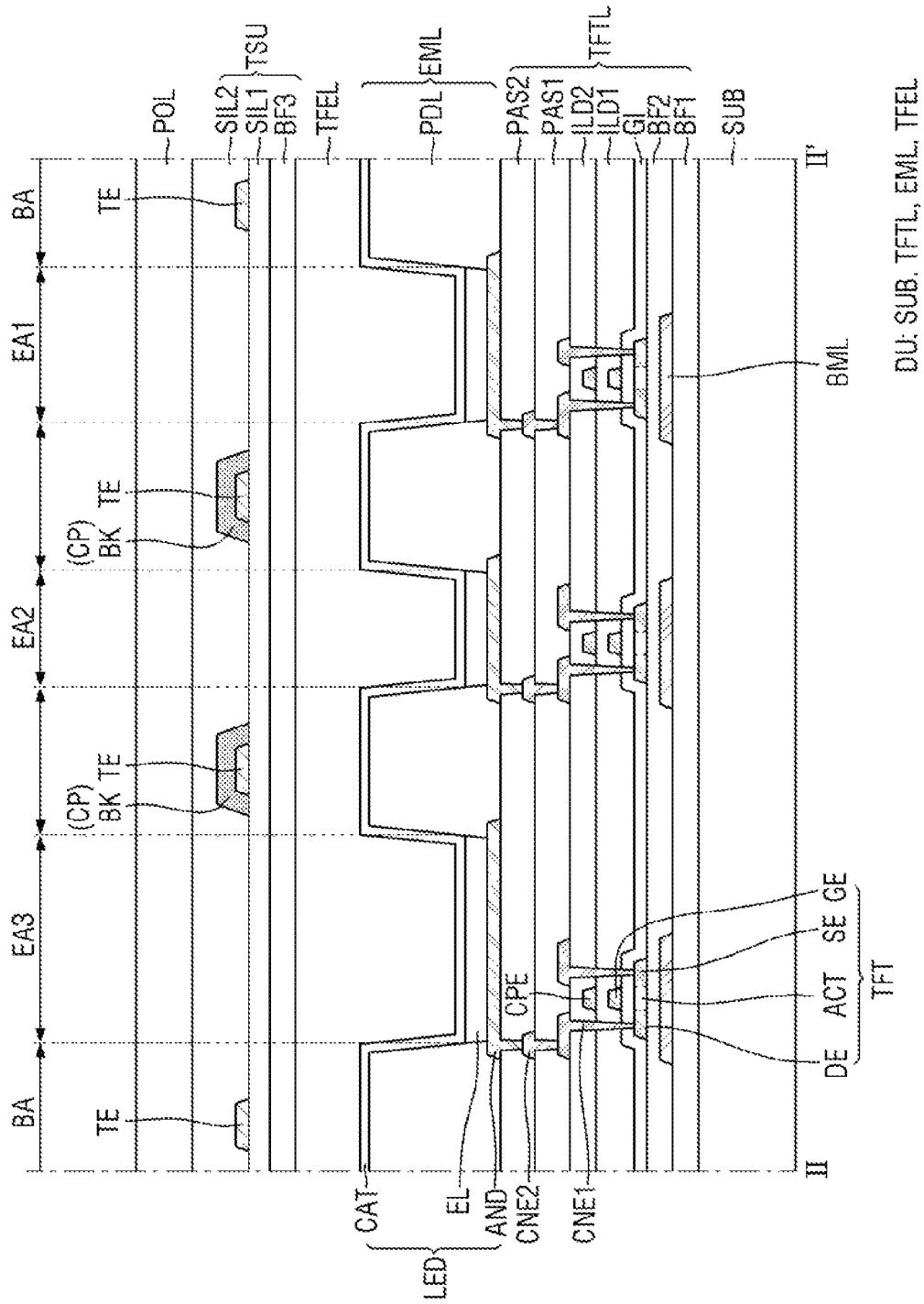
FIG. 9 is a cross-sectional view taken along line II-II' of FIG. 8.

FIG. 8 is an enlarged view illustrating an example of an area A2 of FIG. 4, and FIG. 9 is a cross-sectional view taken along line II-II' of FIG. 8. The area A2 of FIG. 8 further includes a code pattern CP, and the same elements as those described above will be described briefly.

Referring to FIGS. 8 and 9, the touch sensing unit TSU may further include a light-shielding part BK covering a portion of the plurality of touch electrodes SEN and a code pattern CP determined by a plane shape of the light-shielding part BK. The light-shielding part BK may cover an upper surface and a side of the touch electrode SEN. The light-shielding part BK may cover a portion of the driving electrodes TE or a portion of the sensing electrodes RE. An outer periphery of the code pattern CP may have a closed loop shape. When the code pattern CP surrounds the plurality of light emission areas, the code pattern CP may be formed in a planar mesh structure or a netted structure. The display device 10 may include the code pattern CP having a closed loop shape, thereby improving identification sensitivity of the code pattern CP. One code pattern CP may surround at least one of the first to third light emission areas EA1, EA2 and EA3 on a plane. The code pattern CP may not overlap the first to third light emission areas EA1, EA2 and EA3. Therefore, the display device 10 may prevent luminance of light emitted from the first to third light emission areas EA1, EA2 and EA3 from being reduced by the light-shielding part BK or the code pattern CP.

The light-shielding part BK may absorb light of a specific wavelength, and the touch electrode SEN may reflect light of a specific wavelength. The light-shielding part BK may include an infrared absorbing material or an ultraviolet absorbing material, and the plurality of touch electrodes SEN may include an infrared reflective material or an ultraviolet reflective material. For example, the light-shielding part BK may include an inorganic black pigment or an organic black pigment. The inorganic black pigment may be carbon black, and the organic black pigment may include, but is not limited to, at least one of lactam black, perylene black or aniline black. Therefore, when a camera photographs the touch sensing unit TSU by using infrared rays or ultraviolet rays, the light-shielding part BK covering a portion of the touch electrode SEN may be distinguished from another portion of the touch electrode SEN, which is not covered by the light-shielding part BK. The code pattern CP may be photographed by the camera using infrared rays or ultraviolet rays, whereby image quality of the display device 10 should not be deteriorated.

The plurality of code patterns CP may be disposed over the entire area of the touch sensor area TSA of the touch sensing unit TSU, and each of the plurality of code patterns CP may have position information according to a specific reference. The code pattern CP may be photographed by a camera approaching the front of the display device 10, and may be identified through a photographed image or an image. At least one code pattern CP or combination of the code patterns CP may correspond to values of preset data codes. For example, the code pattern CP disposed at a specific position may correspond to a data code designated at the corresponding position.

The display device 10 may include a light-shielding part BK covering a portion of the plurality of touch electrodes SEN and a plurality of code patterns CP determined by a plane shape of the light-shielding part BK, thereby receiving an input from an input device such as an input pen. In this case, the input pen may be a smart pen, an electromagnetic pen or an active pen, but is not limited thereto. At least one code pattern CP or combination of the code patterns CP may have position information according to a specific reference, and may correspond to preset data codes in a one-to-one relationship. In an exemplary embodiment, the display device 10 includes a memory device storing a table, where each entry of the table includes one of a plurality of codes that corresponds to all possible supported code patterns CP and a certain coordinate on a display panel of the display device. For example, if a user touches a display panel of the display device 10 with a pen including a camera, the camera captures an image, a pattern can be extracted from the image, the extracted pattern can be converted into a code, and the resulting code can be compared against the codes in the table to determine the coordinate touched. Therefore, the display device 10 may receive coordinate data generated without complex calculation and correction by using the data codes, thereby performing a corresponding function based on an accurate input coordinate, reducing costs, reducing power consumption and simplifying a driving process. Also, the display device 10 may include a light-shielding part BK covering a portion of the touch electrode SEN, thereby being applied to all electronic devices having a touch function without restriction in size.

Figure 10:
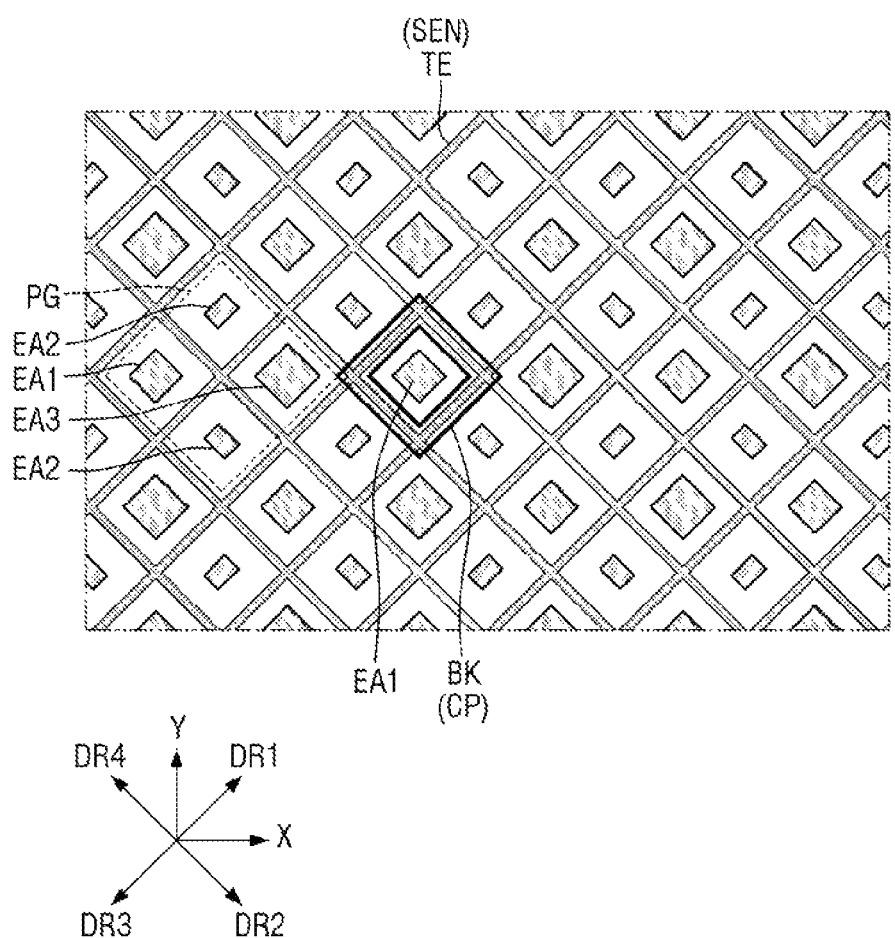
FIG. 10 is a view illustrating an example of a code pattern of a display device according to an embodiment of the present disclosure.
Figure 11:
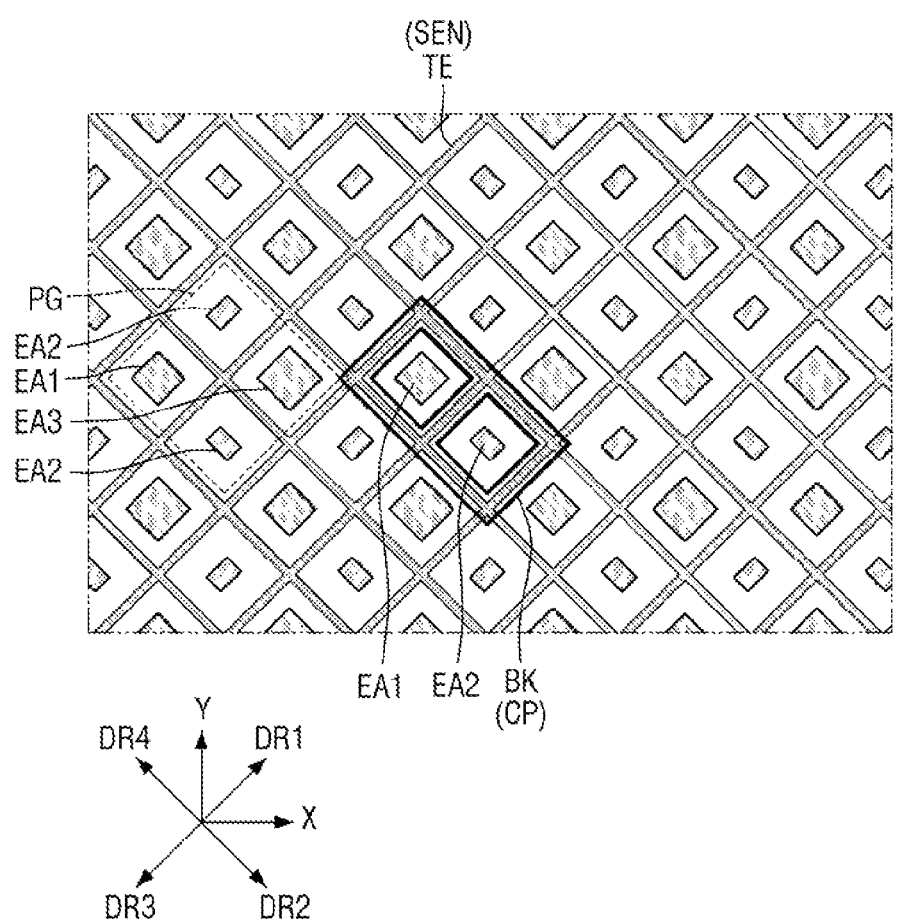
FIG. 11 is a view illustrating an example of a code pattern of a display device according to an embodiment of the present disclosure.
Figure 12:
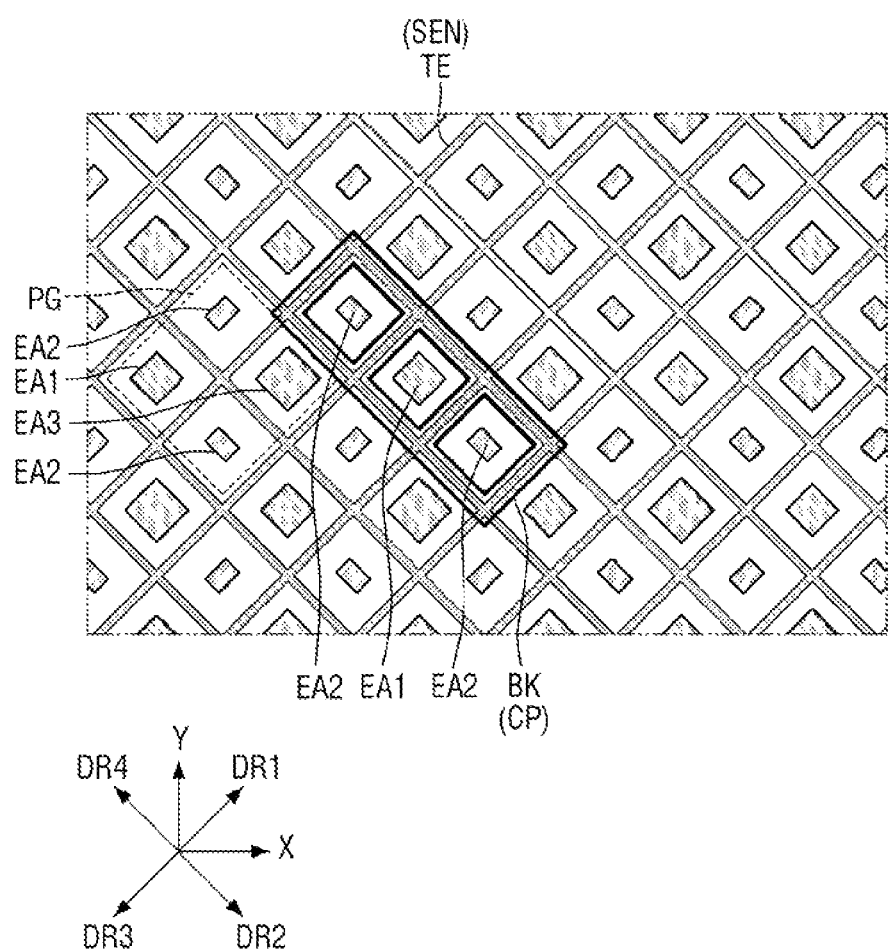
FIG. 12 is a view illustrating an example of a code pattern of a display device according to an embodiment of the present disclosure.
Figure 13:
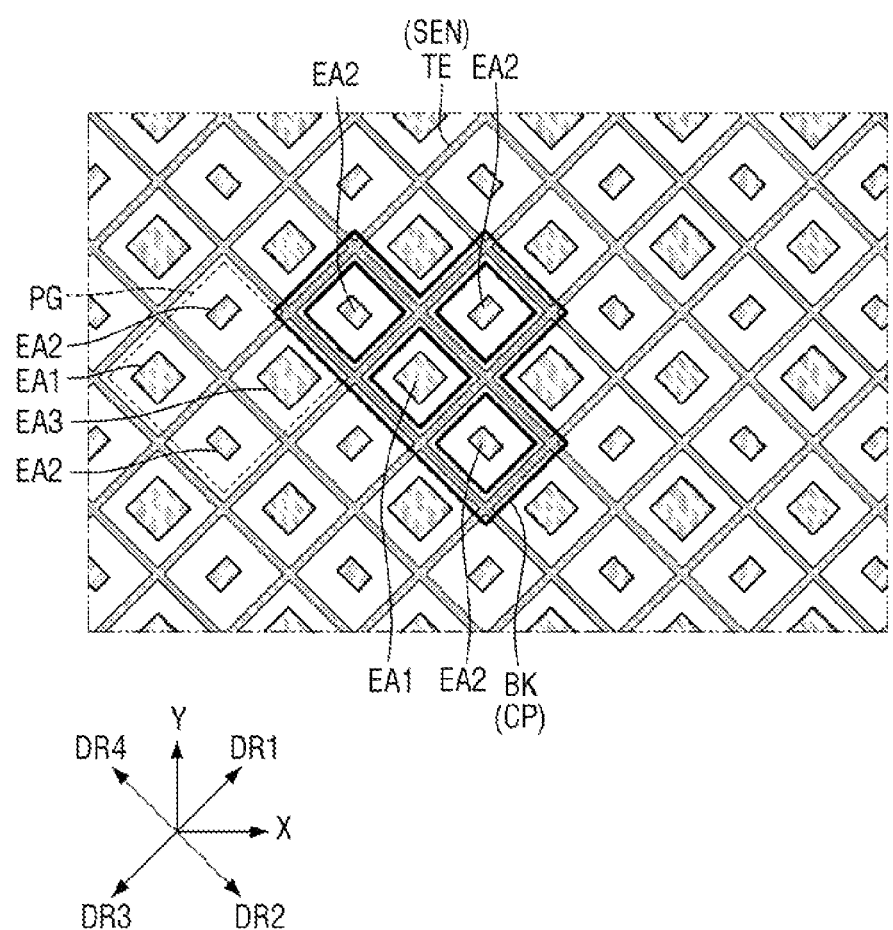
FIG. 13 is a view illustrating an example of a code pattern of a display device according to an embodiment of the present disclosure.
Figure 14:
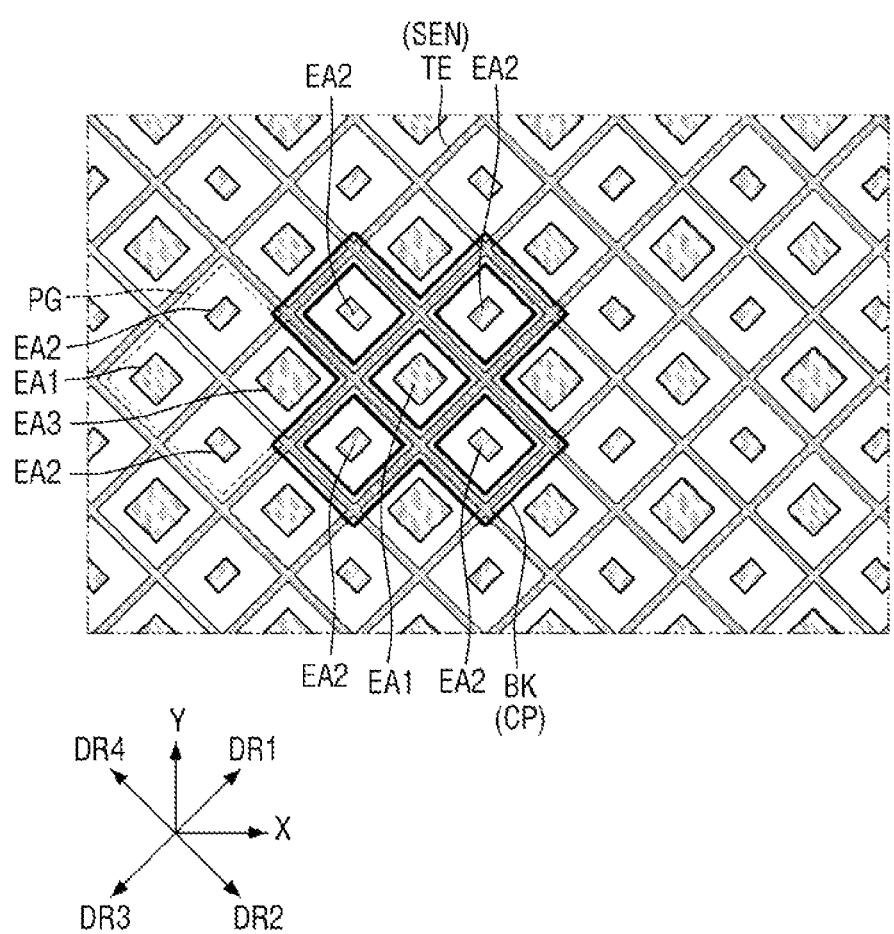
FIG. 14 is a view illustrating an example of a code pattern of a display device according to an embodiment of the present disclosure.

FIG. 10 is a view illustrating an example of a code pattern of a display device according to an embodiment of the present disclosure. FIG. 11 is a view illustrating an example of a code pattern of a display device according to an embodiment of the present disclosure, and FIG. 12 is a view illustrating an example of a code pattern of a display device according to an embodiment of the present disclosure. FIG. 13 is a view illustrating further an example of a code pattern of a display device according to an embodiment of the present disclosure, and FIG. 14 is a view illustrating an example of a code pattern of a display device according to an embodiment of the present disclosure.

Referring to FIGS. 10 to 14, the light-shielding part BK may cover a portion of the plurality of touch electrodes SEN. The outer periphery of the code pattern CP may have a closed loop shape. When the code pattern CP surrounds the plurality of light emission areas, the code pattern CP may be formed in a planar mesh structure or a netted structure. The display device 10 may include the code pattern CP having a closed loop shape, thereby improving identification sensitivity of the code pattern CP. One code pattern CP may surround at least one of the first to third light emission areas EA1, EA2 and EA3 on a plane. In an embodiment, the code pattern CP does not overlap the first to third light emission areas EA1, EA2 and EA3.

In FIG. 10, the code pattern CP may surround one first light emission area EA1. In another example, the code pattern CP may surround one second light emission area EA2 or one third light emission area EA3. Therefore, the code pattern CP may be identified by an input device by surrounding one light emission area. For example, when a device detects a pattern that surrounds only one light emission area, the device may conclude that the detected pattern is a code pattern CP of a first type.

In FIG. 11, the code pattern CP may surround the first light emission area EA1 and the second light emission area EA2 disposed in the second direction DR2 of the first light emission area EA1. Therefore, the outer periphery of the code pattern CP may surround two adjacent light emission areas, and the code pattern CP may be identified by the input device. For example, when a device detects a pattern that surrounds only two light emission areas, the device may conclude that the detected pattern is a code pattern CP of a second type different from the first type.

In FIG. 12, the code pattern CP may surround the first light emission area EA1, and the second light emission area EA2 disposed in each of the second direction DR2 and the fourth direction DR4 of the first light emission area EA1. Therefore, the outer periphery of the code pattern CP may surround three light emission areas arranged in one direction, and the code pattern CP may be identified by the input device. For example, when a device detects a pattern that surrounds only three adjacent light emission areas in one direction, the device may conclude that the detected pattern is a code pattern CP of a third type different from the first and second types.

In FIG. 13, the code pattern CP may surround the first light emission area EA1 and the second light emission areas EA2 disposed in each of the first direction DR1, the second direction DR2 and the fourth direction DR4 of the first light emission area EA1. Therefore, the outer periphery of the code pattern CP may surround four light emission areas arranged in a '⊥' shape, and the code pattern CP may be identified by the input device. For example, when a device detects a pattern that surrounds fourth adjacent light emission areas, where three of the four are adjacent in one direction and two of the four are adjacent in a second direction intersecting the first direction, the device may conclude that the detected pattern is a code pattern CP of a fourth type different from the first, second, and third types.

In FIG. 14, the code pattern CP may surround the first light emission area EA1 and the second light emission areas EA2 disposed in each of the first to fourth directions DR1, DR2, DR3 and DR4 of the first light emission area EA1. Therefore, the outer periphery of the code pattern CP may surround five light emission areas arranged in a '+' shape, and the code pattern CP may be identified by the input device. For example, when a device detects a pattern that surrounds five adjacent light emission areas, where three of the five are adjacent in one direction and three of the five are adjacent in a second direction intersecting the first direction, the device may conclude that the detected pattern is a code pattern CP of a fifth type different from the first, second, third, and fourth types.

Figure 15:
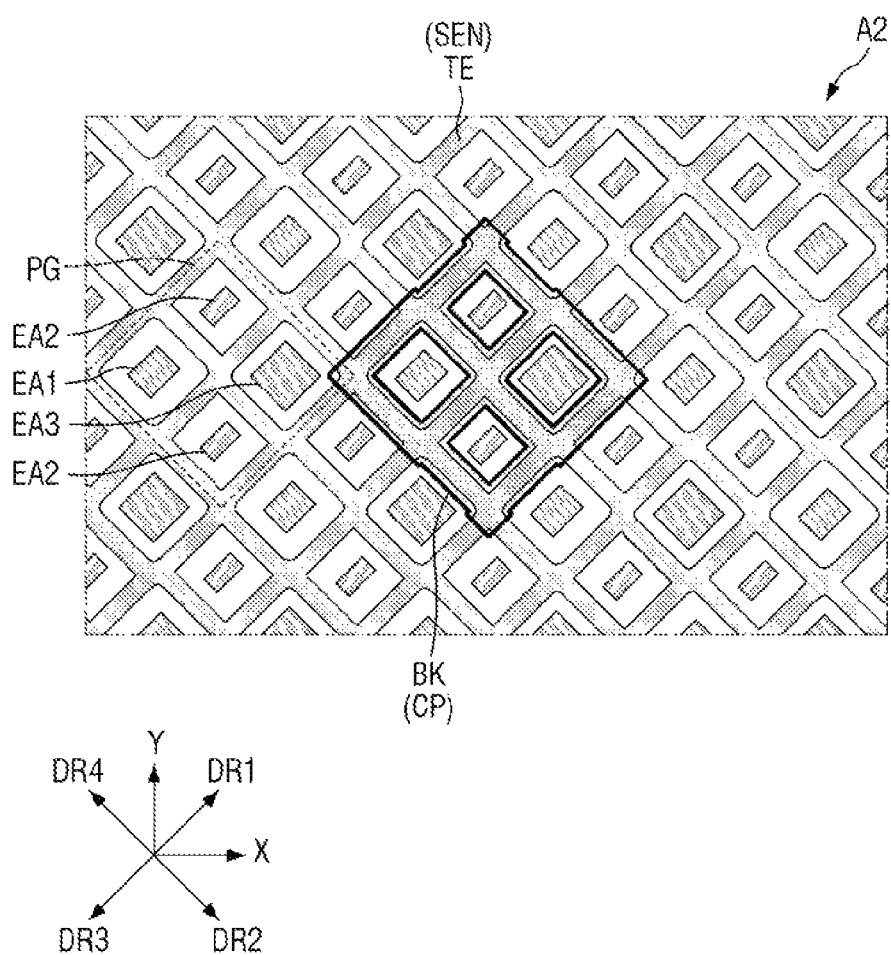
FIG. 15 is a view illustrating further an example of a code pattern of a display device according to an embodiment of the present disclosure.

FIG. 15 is a view illustrating an example of a code pattern of a display device according to an embodiment of the present disclosure. The display device of FIG. 15 has configurations of the touch electrode SEN and the light-shielding part BK, which are different from those of FIG. 8, and the same elements as those described above will be described briefly.

Referring to FIG. 15, sizes of the first to third light emission areas EA1, EA2 and EA3 may be different from one another. For example, the size of the third light emission area EA3 may be greater than that of the first light emission area EA1, and the size of the first light emission area EA1 may be greater than that of the second light emission area EA2, but they are not limited thereto.

The touch electrode SEN may be formed in a planar mesh structure or a netted structure. The touch electrode SEN may surround each of the first to third light emission areas EA1, EA2 and EA3 of the pixel group PG on the plane. Circumferences or perimeters of the touch electrodes SEN respectively surrounding the first to third light emission areas EA1, EA2 and EA3 may be different from one another. For example, the circumference of the touch electrode SEN surrounding the third light emission area EA3 may be greater than the circumference of the touch electrode SEN surrounding the first light emission area EA1, and the circumference of the touch electrode SEN surrounding the first light emission area EA1 may be greater than the circumference of the touch electrode SEN surrounding the second light emission area EA2. Therefore, the shape of the touch electrode SEN may correspond to the sizes of the first to third light emission areas EA1, EA2 and EA3.

The touch sensing unit TSU may further include a light-shielding part BK covering a portion of the plurality of touch electrodes SEN and a code pattern CP determined by a plane shape of the light-shielding part BK. The light-shielding part BK may cover an upper surface and a side of the touch electrode SEN. The light-shielding part BK may cover a portion of the driving electrodes TE or a portion of the sensing electrodes RE. The light-shielding part BK may surround each of the first to third light emission areas EA1, EA2 and EA3. For example, a circumference of the light-shielding part BK surrounding the third light emission area EA3 may be greater than that of the light-shielding part BK surrounding the first light emission area EA1, and a circumference of the light-shielding part BK surrounding the first light emission area EA1 may be greater than that of the light-shielding part BK surrounding the second light emission area EA2. The shape of the light-shielding part BK may correspond to the sizes of the first to third light emission areas EA1, EA2 and EA3.

Circumferences of the code pattern CP respectively surrounding the first to third light emission areas EA1, EA2 and EA3 may be different from one another. The circumference of the code pattern CP surrounding the third light emission area EA3 may be greater than that of the code pattern CP surrounding the first light emission area EA1, and the circumference of the code pattern CP surrounding the first light emission area EA1 may be greater than that of the code pattern CP surrounding the second light emission area EA2. Therefore, the code pattern CP may have various shapes depending on relative sizes of the first to third light emission areas EA1, EA2 and EA3, and may have position information according to the shape.

The outer periphery of the code pattern CP may have a closed loop shape. When the code pattern CP surrounds the plurality of light emission areas, the code pattern CP may be formed in a planar mesh structure or a netted structure. The display device 10 may include the code pattern CP having a closed loop shape, thereby improving identification sensitivity of the code pattern CP. One code pattern CP may surround at least one of the first to third light emission areas EA1, EA2 and EA3 on a plane. In an embodiment, the code pattern CP does not overlap the first to third light emission areas EA1, EA2 and EA3. Therefore, the display device 10 may prevent luminance of light emitted from the first to third light emission areas EA1, EA2 and EA3 from being reduced by the light-shielding part BK or the code pattern CP.

Figure 16:
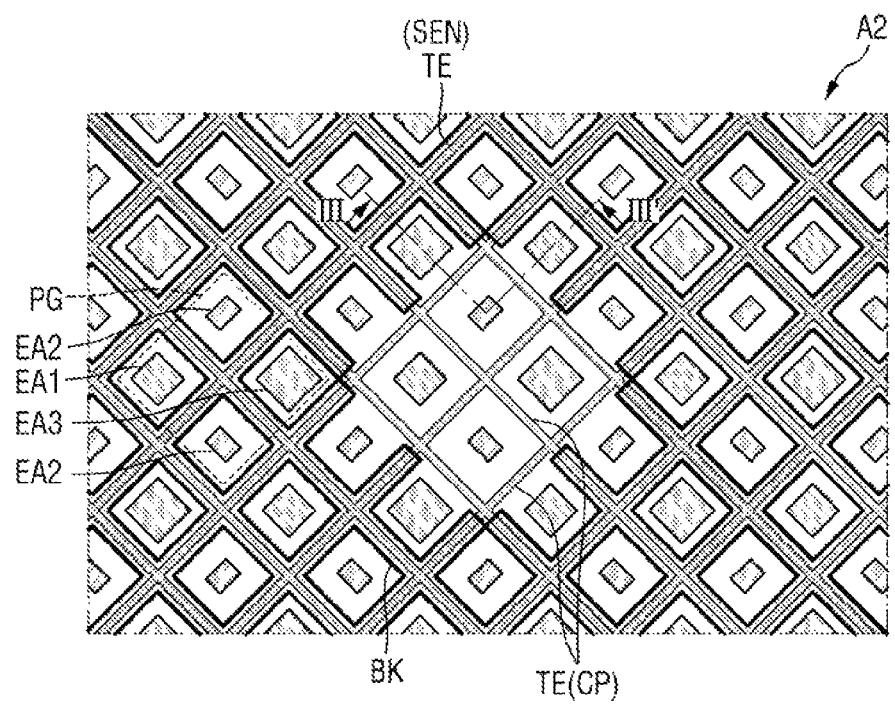
FIG. 16 is an enlarged view illustrating an example of an area A2 of FIG. 4.
Figure 16:
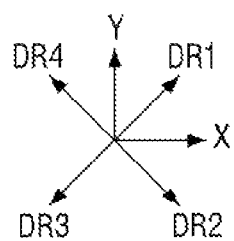
Figure 17:
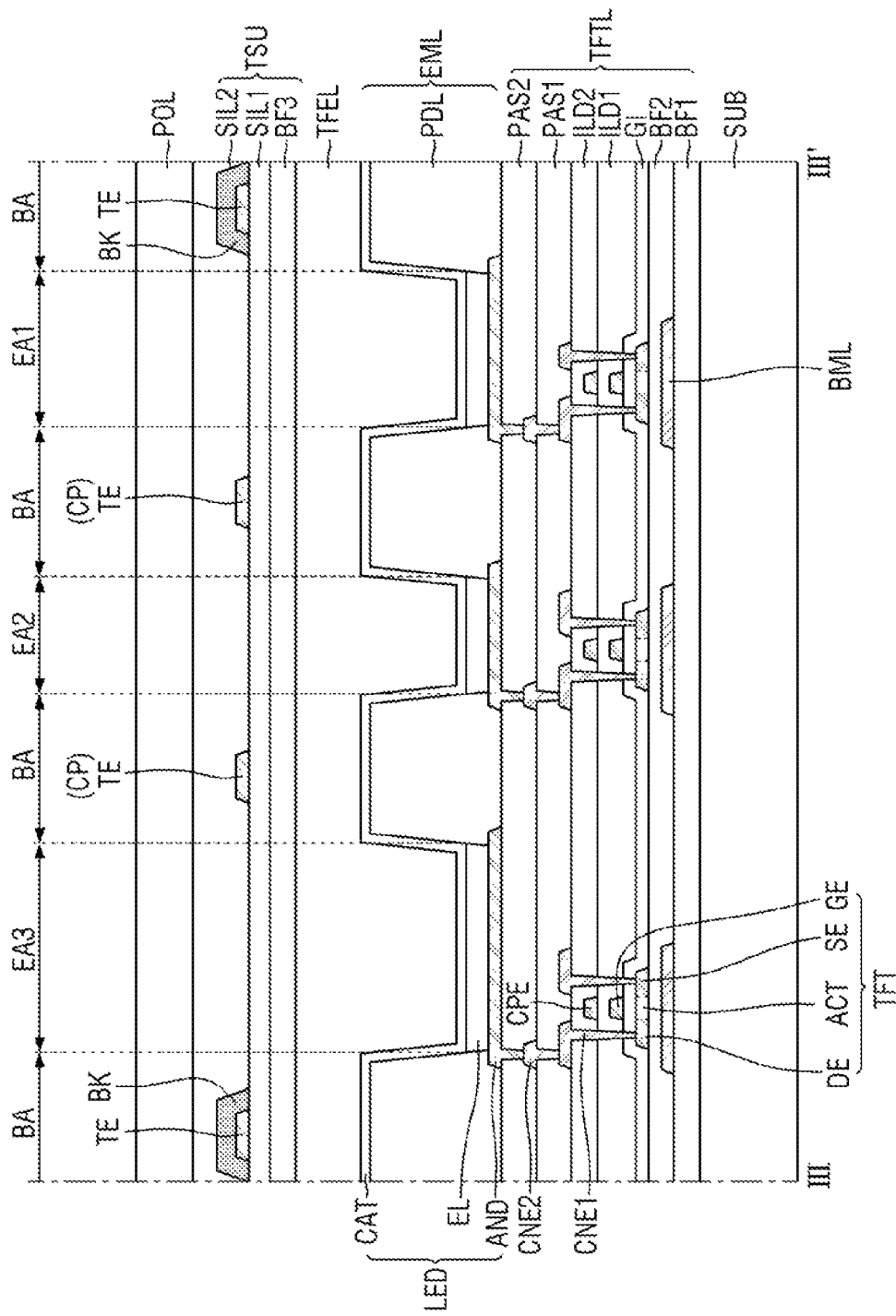
FIG. 17 is a cross-sectional view taken along line III-III' of FIG. 16.

FIG. 16 is an enlarged view illustrating an example of an area A2 of FIG. 4, and FIG. 17 is a cross-sectional view taken along line III-III' of FIG. 16. The display device of FIGS. 16 and 17 has a configuration of the code pattern CP, which is different from that of the display device of FIGS. 8 and 9, and the same elements as those described above will be described briefly.

Referring to FIGS. 16 and 17, the touch sensing unit TSU may further include a light-shielding part BK covering a portion of the plurality of touch electrodes SEN and a code pattern CP determined by a plane shape of the touch electrode SEN that is not covered by the light-shielding part BK. The light-shielding part BK may cover an upper surface and a side of the touch electrode SEN. The light-shielding part BK may cover a portion of the driving electrodes TE or a portion of the sensing electrodes RE. The outer periphery of the code pattern CP may have a closed loop shape. When the code pattern CP surrounds the plurality of light emission areas, the code pattern CP may be formed in a planar mesh structure or a netted structure. The display device 10 may include the code pattern CP having a closed loop shape, thereby improving identification sensitivity of the code pattern CP. One code pattern CP may surround at least one of the first to third light emission areas EA1, EA2 and EA3 on a plane. In an embodiment, the code pattern CP does not overlap the first to third light emission areas EA1, EA2 and EA3. Therefore, the display device 10 may prevent luminance of light emitted from the first to third light emission areas EA1, EA2 and EA3 from being reduced by the light-shielding part BK or the code pattern CP.

The light-shielding part BK may absorb light of a specific wavelength, and the touch electrode SEN may reflect light of a specific wavelength. The light-shielding part BK may include an infrared absorbing material or an ultraviolet absorbing material, and the plurality of touch electrodes SEN may include an infrared reflective material or an ultraviolet reflective material. For example, the light-shielding part BK may include an inorganic black pigment or an organic black pigment. The inorganic black pigment may be carbon black, and the organic black pigment may include, but is not limited to, at least one of lactam black, perylene black or aniline black. Therefore, when the camera photographs the touch sensing unit TSU by using infrared rays or ultraviolet rays, a portion of the touch electrode SEN, which is not covered by the light-shielding part BK, may be distinguished from the light-shielding part BK covering another portion of the touch electrode SEN. The code pattern CP may be photographed by the camera using infrared rays or ultraviolet rays, whereby image quality of the display device 10 should not be deteriorated.

The plurality of code patterns CP may be disposed over the entire area of the touch sensor area TSA of the touch sensing unit TSU, and each of the plurality of code patterns CP may have position information according to a specific reference. The code pattern CP may be photographed by the camera approaching the front of the display device 10, and may be identified through a photographed image or an image. At least one code pattern CP or combination of the code patterns CP may correspond to values of preset data codes. For example, the code pattern CP disposed at a specific position may correspond to a data code designated at the corresponding position.

The display device 10 may include a plurality of code patterns CP determined by the plane shape of the touch electrode SEN that is not covered by the light-shielding part BK, thereby receiving an input from an input device such as an input pen. At least one code pattern CP or combination of the code patterns CP may have position information according to a specific reference, and may correspond to preset data codes in a one-to-one relationship. Therefore, the display device 10 may receive coordinate data generated without complex calculation and correction by using the data codes, thereby performing a corresponding function based on an accurate input coordinate, reducing costs, reducing power consumption and simplifying a driving process. Also, the display device 10 may include a light-shielding part BK covering another portion of the touch electrode SEN, thereby being applied to all electronic devices having a touch function without restriction in size.

Figure 18:
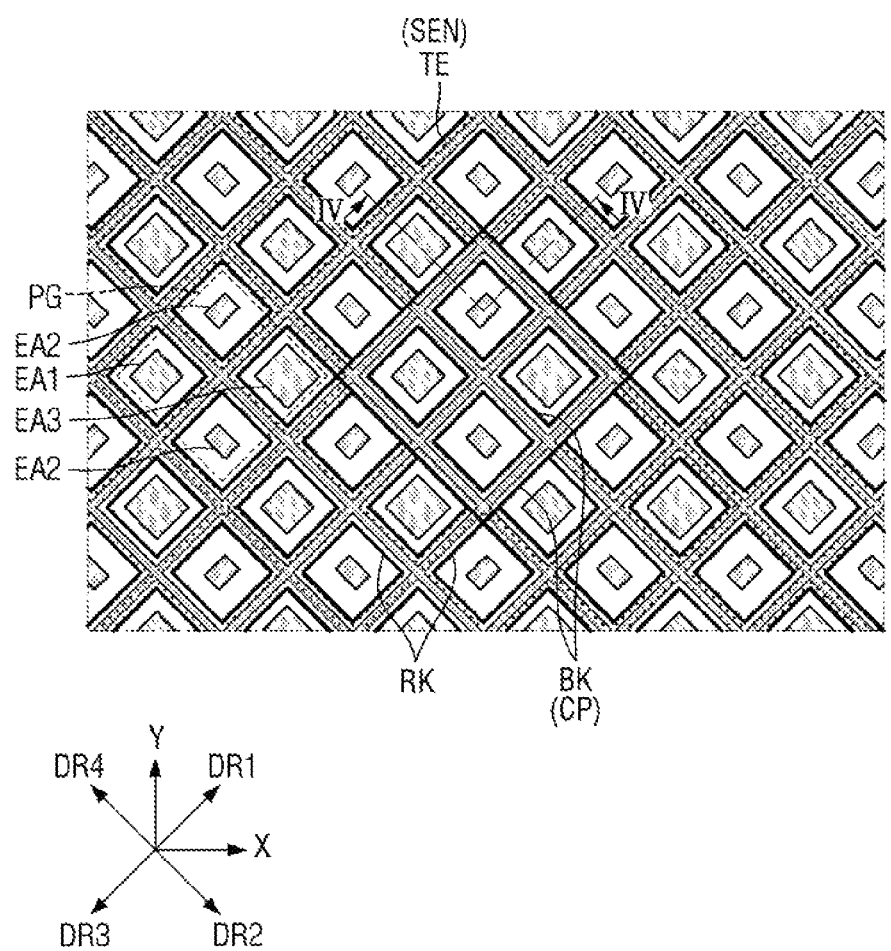
FIG. 18 is an enlarged view illustrating an example of an area A2 of FIG. 4.
Figure 19:
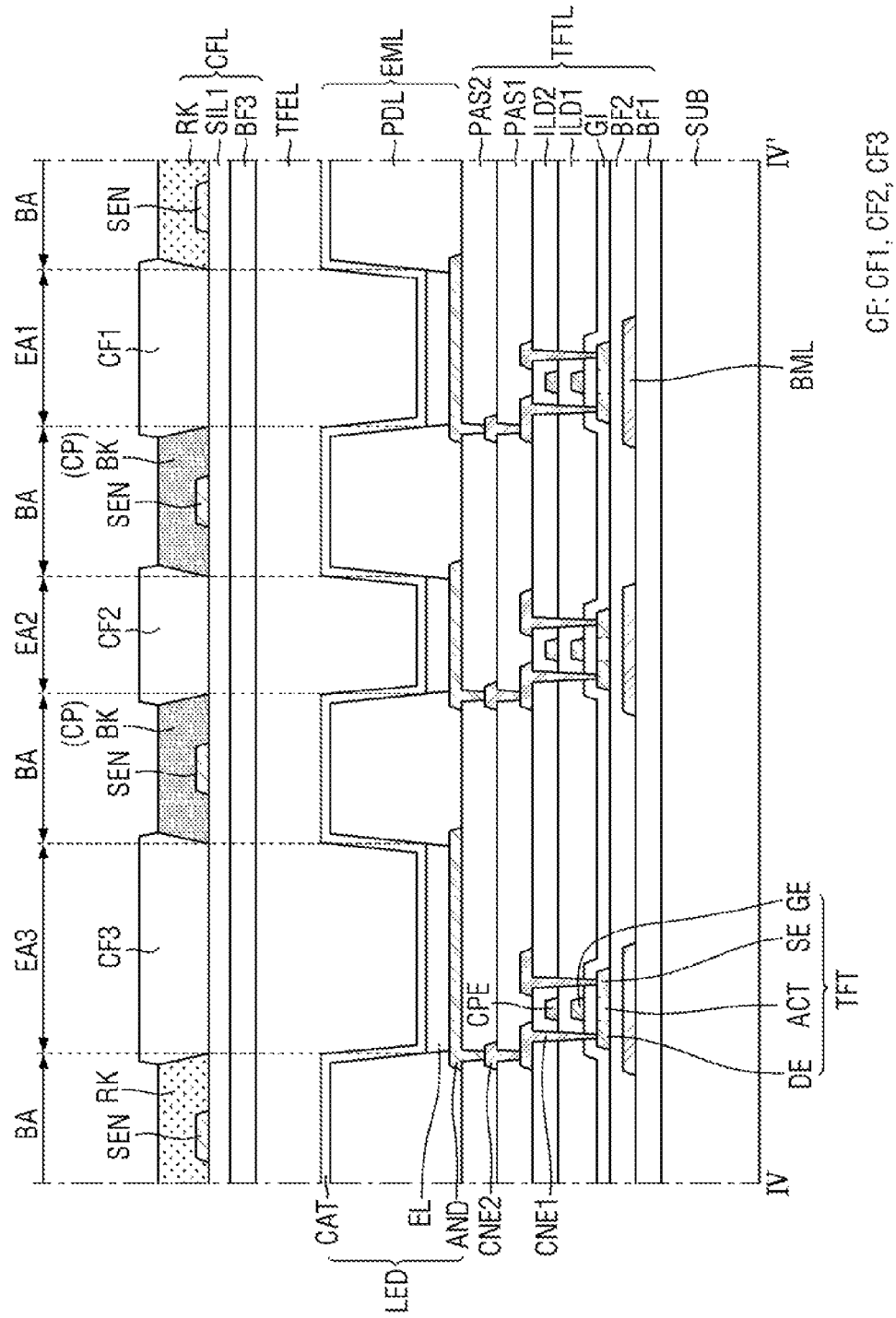
FIG. 19 is a cross-sectional view taken along line IV-IV' of FIG. 18.

FIG. 18 is an enlarged view illustrating an example of an area A2 of FIG. 4, and FIG. 19 is a cross-sectional view taken along line IV-IV' of FIG. 18. The display device of FIGS. 18 and 19 has an upper configuration of the encapsulation layer TFEL, which is different from the display device of FIGS. 7 and 8, and the same elements as those described above will be described briefly.

Referring to FIGS. 18 and 19, the display panel 100 may include a substrate SUB, a thin film transistor layer TFTL, a light-emitting element layer (EML), an encapsulation layer TFEL, and a color filter layer CFL.

The substrate SUB may be a base substrate or a base member. For example, the substrate SUB may include a glass material or a metal material. In another example, the substrate SUB may include a polymer resin such as polyimide (PI).

The thin film transistor layer TFTL may be disposed on the substrate SUB. The thin film transistor layer TFTL may include a first buffer layer BF1, a light-shielding layer BML, a second buffer layer BF2, a thin film transistor TFT, a gate insulating layer GI, a first interlayer dielectric layer ILD1, a capacitor electrode CPE, a second interlayer dielectric layer ILD2, a first connection electrode CNE1, a first passivation layer PAS1, a second connection electrode CNE2, and a second passivation layer PAS2.

The light-emitting element layer EML may be disposed on the thin film transistor layer TFTL. The light-emitting element layer EML may include a light-emitting element LED and a pixel defining layer PDL. The light-emitting element LED may include a pixel electrode AND, a light-emitting layer EL, and a common electrode CAT.

The encapsulation layer TFEL may be disposed on the common electrode CAT to cover the plurality of light-emitting elements LEDs.

The color filter layer CFL may be disposed on the encapsulation layer TFEL. The color filter layer CFL may include a third buffer layer BF3, a first insulating layer SIL1, a plurality of color filters CF, a light-shielding part BK, a reflective part RK (e.g., a reflective layer), and a plurality of touch electrodes SEN.

The third buffer layer BF3 may be disposed on the encapsulation layer TFEL. The third buffer layer BF3 may have insulation and optical functions. The third buffer layer BF3 may include at least one inorganic layer. Optionally, the third buffer layer BF3 may be omitted.

The first insulating layer SIL1 may be disposed on the third buffer layer BF3. The first insulating layer SIL1 may have insulation and optical functions.

The plurality of color filters CF may include first to third color filters CF1, CF2 and CF3. Each of the first to third color filters CF1, CF2 and CF3 may be disposed to respectively correspond to the first to third light emission areas EA1, EA2 and EA3 on the first insulating layer SIL1.

The first color filter CF1 may be disposed in the first light emission area EA1 on the first insulating layer SIL1 A portion of the first color filter CF1 may be surrounded by the light-shielding part BK, and another portion of the first color filter CF1 may be surrounded by the reflective part RK. The first color filter CF1 may selectively transmit light of a first color (e.g., red light) and shield or absorb light of a second color (e.g., green light) and light of a third color (e.g., blue light). For example, the first color filter CF1 may be a red color filter, and may include a red colorant.

The second color filter CF2 may be disposed in the second light emission area EA2 on the first insulating layer SIL1 A portion of the second color filter CF2 may be surrounded by the light-shielding part BK, and another portion of the second color filter CF2 may be surrounded by the reflective part RK. The second color filter CF2 may selectively transmit light of a second color (e.g., green light) and shield or absorb light of a first color (e.g., red light) and light of a third color (e.g., blue light). For example, the second color filter CF2 may be a green color filter, and may include a green colorant.

The third color filter CF3 may be disposed in the third light emission area EA3 on the first insulating layer SIL1 A portion of the third color filter CF3 may be surrounded by the light-shielding part BK and another portion of the third color filter CF3 may be surrounded by the reflective part RK. The third color filter CF3 may selectively transmit light of a third color (e.g., blue light) and shield or absorb light of a first color (e.g., red light) and light of a second color (e.g., green light). For example, the third color filter CF3 may be a blue color filter, and may include a blue colorant.

The first to third color filters CF1, CF2 and CF3 may reduce reflective light based on external light by absorbing a portion of light incident from the outside of the display device 10. Therefore, the first to third color filters CF1, CF2 and CF3 may prevent color distortion due to external light reflection from occurring.

The color filter layer CFL is directly disposed on the encapsulation layer TFEL so that the display device 10 may not need a separate substrate for the color filter layer CFL. Therefore, a thickness of the display device 10 may relatively be reduced.

The light-shielding part BK may be disposed in a portion of a light-shielding area BA on the encapsulation layer TFEL. The light-shielding part BK may overlap the pixel defining layer PDL in the thickness direction. The light-shielding part BK may absorb visible light, infrared rays and ultraviolet rays. The light-shielding part BK may prevent a color mixture from occurring due to visible light permeated among the first to third light emission areas EA1, EA2 and EA3, thereby improving a color reproduction rate of the display device 10.

For example, the light-shielding part BK may include an inorganic black pigment or an organic black pigment. The inorganic black pigment may be carbon black, and the organic black pigment may include, but is not limited to, at least one of lactam black, perylene black or aniline black.

The color filter layer CFL may further include a code pattern CP determined by a plane shape of the light-shielding part BK. The light-shielding part BK may cover an upper surface and a side of the touch electrode SEN. The outer periphery of the code pattern CP may have a closed loop shape. When the code pattern CP surrounds the plurality of light emission areas, the code pattern CP may be formed in a planar mesh structure or a netted structure. The display device 10 may include the code pattern CP having a closed loop shape, thereby improving identification sensitivity of the code pattern CP. One code pattern CP may surround at least one of the first to third light emission areas EA1, EA2 and EA3 on a plane. In an embodiment, the code pattern CP does not overlap the first to third light emission areas EA1, EA2 and EA3. Therefore, the display device 10 may prevent luminance of light emitted from the first to third light emission areas EA1, EA2 and EA3 from being reduced by the light-shielding part BK or the code pattern CP.

The reflective part RK may be disposed in another portion of the light-shielding area BA, in which the light-shielding part BK is not disposed, on the encapsulation layer TFEL. The reflective part RK may overlap the pixel defining layer PDL in the thickness direction. The reflective part RK may include an absorbing material of visible light, and may include an infrared or ultraviolet reflective material. The reflective part RK may shield visible light and reflect infrared rays or ultraviolet rays. The reflective part RK may prevent a color mixture from occurring due to visible light permeated among the first to third light emission areas EA1, EA2 and EA3, thereby improving a color reproduction rate of the display device 10. The reflective part RK may be disposed in a lattice shape surrounding the first to third light emission areas EA1, EA2 and EA3 on a plane.

For example, the reflective part RK may include a reflective pigment and a black pigment. The black pigment may include, but is not limited to, at least one of carbon black, lactam black, perylene black or aniline black. The reflective part RK may be formed by adjusting specific gravity of the reflective pigment and the black pigment.

In another example, the reflective part RK may be coated with a material that reflects light of a specific wavelength. Therefore, the reflective part RK may shield visible light and reflect infrared rays or ultraviolet rays.

The plurality of touch electrodes SEN may be disposed in the light-shielding area BA on the encapsulation layer TFEL, and may be covered by the light-shielding part BK or the reflective part RK. The plurality of touch electrodes SEN may not need a separate touch sensor layer, and may be disposed in the color filter layer CFL. When the camera photographs the color filter layer CFL by using infrared rays or ultraviolet rays, the light-shielding part BK may be distinguished from the reflective part RK. Therefore, the code pattern CP may be photographed by the camera using infrared rays or ultraviolet rays, whereby image quality of the display device 10 should not be deteriorated.

Figure 20:
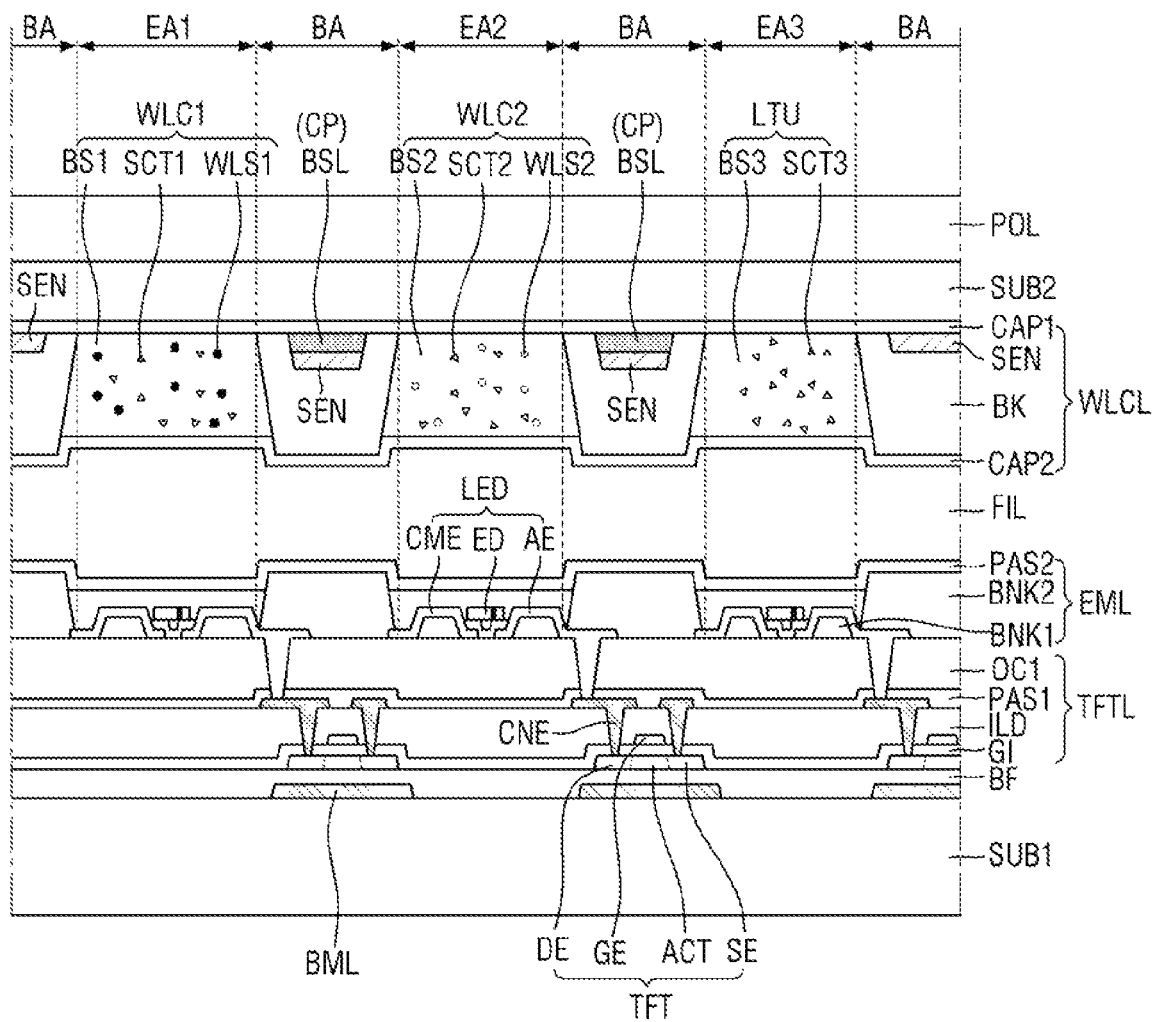
FIG. 20 is a cross-sectional view illustrating a display device according to an embodiment of the present disclosure.

FIG. 20 is a cross-sectional view illustrating a display device according to an embodiment of the present disclosure. The display device of FIG. 20 has a configuration of the light-emitting element layer EML, which is different from that of the display device of FIG. 9, and further includes a wavelength conversion layer WLCL, and the same elements as those described above will be described briefly.

Referring to FIG. 20, the display panel 100 may include a first substrate SUB1, a thin film transistor layer TFTL, a light-emitting element layer EML, a filling layer FIL, a wavelength conversion layer WLCL, a second substrate SUB2 and a polarizing film POL.

The first substrate SUB1 may be a base substrate or a base member. For example, the first substrate SUB1 may include a glass material or a metal material. In another example, the first substrate SUB1 may include a polymer resin such as polyimide (PI).

The thin film transistor layer TFTL may be disposed on the first substrate SUB1. The thin film transistor layer TFTL may include a buffer layer BF, a light-shielding layer BML, a thin film transistor TFT, a gate insulating layer GI, an interlayer dielectric layer ILD, a connection electrode CNE, a first passivation layer PAS1, and a first planarization layer OC1.

The light-emitting element layer EML may be disposed on the thin film transistor layer TFTL. The light-emitting element layer EML may include a light-emitting diode LED, a first bank BNK1, a second bank BNK2, and a second passivation layer PAS2.

The light-emitting element LED may be disposed on the thin film transistor layer TFTL. The light-emitting element LED may include a first electrode AE, a second electrode CME and a light-emitting diode ED.

The first electrode AE may be disposed on the first planarization layer OC1. For example, the first electrode AE may cover the first bank BNK1 provided on the first planarization layer OC1. The first electrode AE may be disposed to overlap one of the first to third light emission areas EA1, EA2 and EA3 defined by the second bank BNK2. The first electrode AE may be connected to the drain electrode DE of the thin film transistor TFT through the connection electrode CNE. The first electrode AE may be an anode electrode of the light-emitting diode LED, but is not limited thereto.

The second electrode CME may be spaced apart from the first electrode AE on the first planarization layer OC1. For example, the second electrode CME may cover the first bank BNK1 disposed on the first planarization layer OC1. The second electrode CME may be disposed to overlap one of the first to third light emission areas EA1, EA2 and EA3 defined by the second bank BNK2. For example, the second electrode CME may receive a low potential voltage supplied from a low potential line to the entire pixels. The second electrode CME may be a cathode electrode of the light-emitting diode LED, but is not limited thereto.

The light-emitting diode ED may be disposed between the first electrode AE and the second electrode CME on the first planarization layer OC1. One end of the light-emitting diode ED may be connected to the first electrode AE, and the other end of the light-emitting diode ED may be connected to the second electrode CME. The light emitting diode ED may have a size of a micro-meter or a nano-meter, and may be an inorganic light-emitting diode that includes an inorganic material. The inorganic light-emitting diode may be aligned between two electrodes in accordance with an electric field formed in a specific direction between the two electrodes facing each other.

For example, the plurality of light-emitting diodes ED may include active layers having the same material to emit light of the same wavelength band or light of the same color. The light emitted from each of the first to third light emission areas EA1, EA2 and EA3 may have the same color. For example, the plurality of light-emitting diodes ED may emit light of a third color or blue light, which has a peak wavelength ranging from 440 nm to 480 nm. Therefore, the light-emitting element layer EML may emit light of a third light or blue light.

The second bank BNK2 may be disposed in the light-shielding area BA on the first planarization layer OC1. The second bank BNK2 may define the first to third light emission areas EA1, EA2 and EA3. For example, the second bank BNK2 may surround each of the first to third light emission areas EA1, EA2 and EA3, but is not limited thereto. The second bank BNK2 may separate and insulate the first electrode AE or the second electrode CME of each of the plurality of light-emitting elements LED from another first electrode or another second electrode.

The second passivation layer PAS2 may be disposed on the plurality of light-emitting elements LED and the second bank BNK2. The second passivation layer PAS2 may cover the plurality of light-emitting elements LED, and may protect the plurality of light-emitting elements LEDs. The second passivation layer PAS2 may prevent impurities such as external moisture or air from being permeated thereinto, thereby preventing the plurality of light-emitting elements LED from being damaged.

The filling layer FIL may fill a space between the light-emitting element layer EML and the wavelength conversion layer WLCL, and may be surrounded by a sealing member. For example, the filling layer FIL may be made of an organic material, and may transmit light. The filling layer FIL may be made of a silicon-based organic material, an epoxy-based organic material or the like, but is not limited thereto. For another example, the filling layer FIL may be omitted.

The wavelength conversion layer WLCL may include a second capping layer CAP2, a light-shielding part BK, a light-shielding pattern BSL, a plurality of touch electrodes SEN, a first wavelength converter WLC1, a second wavelength converter WLC2, a light-transmitting unit LTU, and a first capping layer CAP1.

The second capping layer CAP2 may be disposed on the filling layer FIL. The second capping layer CAP2 may cover lower surfaces of the first and second wavelength converters WLC1 and WLC2, the light-transmitting unit LTU and the light-shielding part BK. For example, the second capping layer CAP2 may seal the first and second wavelength converters WLC1 and WLC2 and the light-transmitting unit LTU to prevent the first and second wavelength converters WLC1 and WLC2 and the light-transmitting unit LTU from being damaged or contaminated. For example, the second capping layer CAP2 may include an inorganic material.

The first wavelength converter WLC1 may be disposed in the first light emission area EA1 on the second capping layer CAP2. The first wavelength converter WLC1 may be surrounded by the light-shielding part BK. The first wavelength converter WLC1 may include a first base resin BS1, a first scatterer SCT1 and a first wavelength shifter WLS1.

The first base resin BS1 may include a material having relatively high light transmittance. The first base resin BS1 may be made of a transparent organic material.

The first scatterer SCT1 may have a refractive index different from that of the first base resin BS1, and may form an optical interface with the first base resin BS1. For example, the first scatterer SCT1 may include a light-scattering material or light-scattering particles, which scatters (or scatter) at least a portion of transmissive light. The first scatterer SCT1 may scatter light in a random direction regardless of an incident direction of incident light without substantially converting a peak wavelength of the incident light.

The first wavelength shifter WLS1 may convert or shift the peak wavelength of the incident light to a first peak wavelength. For example, the first wavelength shifter WLS1 may convert blue light provided by the display device 10 into red light having a single peak wavelength ranging from 610 nm to 650 nm and emit the converted light.

The second wavelength converter WLC2 may be disposed in the second light emission area EA2 on the second capping layer CAP2. The second wavelength converter WLC2 may be surrounded by the light-shielding part BK. The second wavelength converter WLC2 may include a second base resin BS2, a second scatterer SCT2 and a second wavelength shifter WLS2.

The second base resin BS2 may include a material having relatively high light transmittance. The second base resin BS2 may be made of a transparent organic material.

The second scatterer SCT2 may have a refractive index different from that of the second base resin BS2, and may form an optical interface with the second base resin BS2. For example, the second scatterer SCT2 may include a light-scattering material or light-scattering particles, which scatters (or scatter) at least a portion of transmissive light. The second scatterer SCT2 may scatter light in a random direction regardless of an incident direction of incident light without substantially converting a peak wavelength of the incident light.

The second wavelength shifter WLS2 may convert or shift the peak wavelength of the incident light into a second peak wavelength different from the first peak wavelength of the first wavelength shifter WLS1. For example, the second wavelength shifter WLS2 may convert blue light provided by the display device 10 into green light having a single peak wavelength ranging from 510 nm to 550 nm and emit the converted light.

The light-transmitting unit LTU may be disposed in the third light emission area EA3 on the second capping layer CAP2. The light-transmitting unit LTU may be surrounded by the light-shielding part BK. The light-transmitting unit LTU may transmit the incident light by maintaining the peak wavelength of the incident light. The light-transmitting unit LTU may include a third base resin BS3 and a third scatterer SCT3.

The third base resin BS3 may include a material having relatively high light transmittance. The third base resin BS3 may be made of a transparent organic material.

The third scatterer SCT3 may have a refractive index different from that of the third base resin BS3, and may form an optical interface with the third base resin BS3. For example, the third scatterer SCT3 may include a light-scattering material or light-scattering particles, which scatters (or scatter) at least a portion of transmissive light. The third scatterer SCT3 may scatter light in a random direction regardless of an incident direction of incident light without substantially converting a peak wavelength of the incident light.

The light-shielding part BK may be disposed in the light-shielding area BA on the second capping layer CAP2. The light-shielding part BK may cover a lower surface of the plurality of touch electrodes SEN. The light-shielding part BK may overlap the second bank BNK2 in the thickness direction. The light-shielding part BK may surround the first and second wavelength converters WLC1 and WLC2 and the light-transmitting unit LTU on a plane. The light-shielding part BK may shield transmission of light. The light-shielding part BK may prevent a color mixture from occurring due to visible light permeated among the first to third light emission areas EA1, EA2 and EA3, thereby improving a color reproduction rate of the display device 10. The light-shielding part BK may be disposed in a lattice shape surrounding the first to third light emission areas EA1, EA2 and EA3 on a plane.

The light-shielding pattern BSL may be disposed on one surface of the first capping layer CAP1 facing the first substrate SUB1. The light-shielding pattern BSL may be disposed on a portion of the touch electrodes SEN. The light-shielding pattern BSL may absorb light of a specific wavelength, and another portion of the touch electrode SEN that is not overlapped with the light-shielding pattern BSL may reflect light of a specific wavelength. The light-shielding pattern BSL may include an infrared absorbing material or an ultraviolet absorbing material, and the plurality of touch electrodes SEN may include an infrared reflective material or an ultraviolet reflective material. For example, the light-shielding pattern BSL may include an inorganic black pigment or an organic black pigment. The inorganic black pigment may be carbon black, and the organic black pigment may include, but is not limited to, at least one of lactam black, perylene black or aniline black.

The wavelength conversion layer WLCL may further include a code pattern CP determined by a plane shape of the light-shielding pattern BSL. The display device 10 may include the code pattern CP having a closed loop shape, thereby improving identification sensitivity of the code pattern CP. One code pattern CP may surround at least one of the first to third light emission areas EA1, EA2 and EA3 on a plane.

Another portion of the plurality of touch electrodes SEN may be disposed on one surface of the first capping layer CAP1 facing the first substrate SUB1. Therefore, an upper surface of a portion of the touch electrode SEN may be covered by the light-shielding pattern BSL, and an upper surface of another portion of the touch electrode SEN may not be covered by the light-shielding pattern BSL. A lower surface of the plurality of touch electrodes SEN may be covered by the light-shielding part BK. Therefore, the plurality of touch electrodes SEN may not need a separate touch sensor layer, and may be disposed in the wavelength conversion layer WLCL.

The display device 10 may include a light-shielding pattern BSL disposed on a portion of the plurality of touch electrodes SEN and a plurality of code patterns CP determined by a plane shape of the light-shielding pattern BSL, thereby receiving an input from an input device such as an input pen. At least one code pattern CP or combination of the code patterns CP may have position information according to a specific reference, and may correspond to preset data codes in a one-to-one relationship. Therefore, the display device 10 may receive coordinate data generated without complex calculation and correction by using the data codes, thereby performing a corresponding function based on an accurate input coordinate, reducing costs, reducing power consumption and simplifying a driving process. Also, the display device 10 may include a light-shielding pattern BSL covering a portion of the touch electrode SEN, thereby being applied to all electronic devices having a touch function without restriction in size.

The first capping layer CAP1 may be disposed on the first and second wavelength converters WLC1 and WLC2, the light-transmitting unit LTU, the light-shielding part BK, the light-shielding pattern BSL disposed on a portion of the touch electrode SEN, and another portion of the touch electrode SEN. The first capping layer CAP1 may be disposed on one surface of the second substrate SUB2 facing the first substrate SUB1. The first capping layer CAP1 may seal upper surfaces of the first and second wavelength converters WLC1 and WLC2 and the light transmitting unit LTU to prevent the first and second wavelength converters WLC1 and WLC2 and the light-transmitting unit LTU from being damaged or contaminated. For example, the first capping layer CAP1 may include an inorganic material.

The second substrate SUB2 may be disposed on the wavelength conversion layer WLCL. The second substrate SUB2 may support and protect the display device 10. The second substrate SUB2 may be a base substrate or a base member. For example, the second substrate SUB2 may include a glass material or a metal material. In another example, the second substrate SUB2 may include a polymer resin such as polyimide (PI).

The polarizing film POL may be disposed on the second substrate SUB2. For example, the polarizing film POL may include a linear polarizing plate and a phase delay film such as a λ/4 plate (quarter-wave plate). The phase delay film and the linear polarizing plate may be sequentially deposited on the second substrate SUB2.

Figure 21:
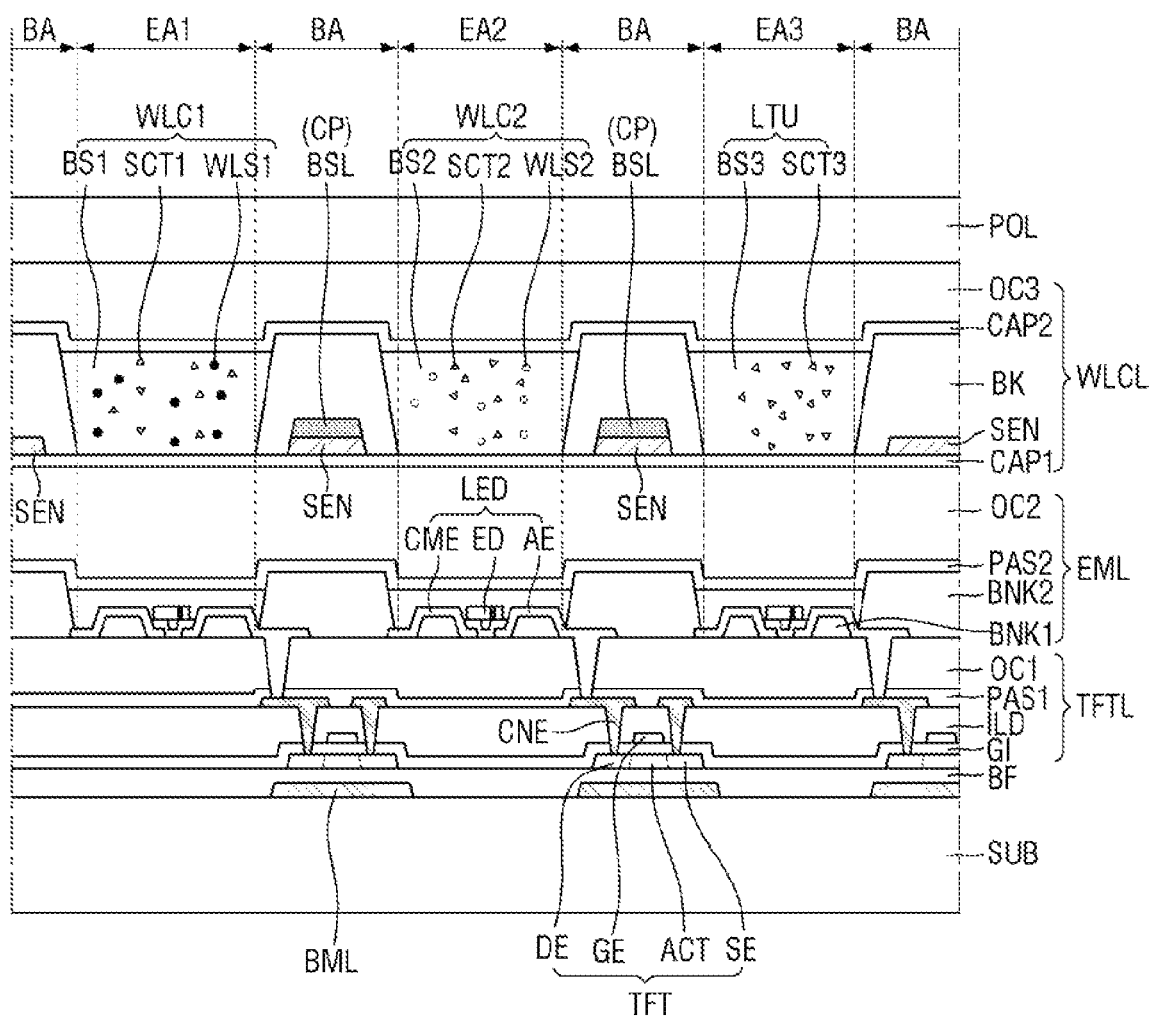
FIG. 21 is a cross-sectional view illustrating a display device according to an embodiment of the present disclosure.

FIG. 21 is a cross-sectional view illustrating a display device according to still another embodiment of the present disclosure. The display device of FIG. 21 includes a configuration of the wavelength conversion layer WLCL, which is different from that of FIG. 20, and does not include the second substrate SUB2, and the same elements as those described above will be described briefly or omitted.

Referring to FIG. 21, the display panel 100 may include a substrate SUB, a thin film transistor layer TFTL, a light-emitting element layer EML, a wavelength conversion layer WLCL, and a polarizing film POL.

The substrate SUB may be a base substrate or a base member. For example, the substrate SUB may include a glass material or a metal material. In another example, the substrate SUB may include a polymer resin such as polyimide (PI).

The thin film transistor layer TFTL may be disposed on the substrate SUB. The thin film transistor layer TFTL may include a buffer layer BF, a light-shielding layer BML, a thin film transistor TFT, a gate insulating layer GI, an interlayer dielectric layer ILD, a connection electrode CNE, a first passivation layer PAS1, and a first planarization layer OC1.

The light-emitting element layer EML may be disposed on the thin film transistor layer TFTL. The light-emitting element layer EML may include a light-emitting element LED, a first bank BNK1, a second bank BNK2, a second passivation layer PAS2, and a second planarization layer OC2. The second planarization layer OC2 may be provided on the second passivation layer PAS2 to planarize an upper end of the light emitting element layer EML. For example, the second planarization layer OC2 may include an organic material.

The wavelength conversion layer WLCL may include a first capping layer CAP1, a light-shielding part BK, a plurality of touch electrodes SEN, a light-shielding pattern BSL, a first wavelength converter WLC1, a second wavelength converter WLC2, a light-transmitting unit LTU, and a second capping layer CAP2.

The first capping layer CAP1 may be disposed on the second planarization layer OC2 of the light emitting element layer EML. The first capping layer CAP1 may seal lower surfaces of the first and second wavelength converters WLC1 and WLC2 and the light-transmitting unit LTU. For example, the first capping layer CAP1 may include an inorganic material.

The light-shielding part BK may be disposed in the light-shielding area BA on the first capping layer CAP1. The light-shielding part BK may overlap the second bank BNK2 in the thickness direction. The light-shielding part BK may surround the first and second wavelength converters WLC1 and WLC2 and the light-transmitting unit LTU on a plane. The light-shielding part BK may shield visible light, and may transmit infrared rays or ultraviolet rays. The light-shielding part BK may prevent a color mixture from occurring due to visible light permeated among the first to third light emission areas EA1, EA2 and EA3, thereby improving a color reproduction rate of the display device 10. The light-shielding part BK may be disposed in a lattice shape surrounding the first to third light emission areas EA1, EA2 and EA3 on a plane.

The plurality of touch electrodes SEN may be disposed in the light-shielding area BA on the first capping layer CAP1. A portion of the touch electrode SEN may be disposed on a lower portion of the light-shielding pattern BSL, and another portion of the touch electrode SEN may be covered by the light-shielding part BK. The plurality of touch electrodes SEN may not need a separate touch sensor layer, and may be disposed in the wavelength conversion layer WLCL. The plurality of touch electrodes SEN may include an infrared reflective material or an ultraviolet reflective material. Therefore, the plurality of touch electrodes SEN may reflect infrared rays or ultraviolet rays that have transmitted the light-shielding part BK.

The light-shielding pattern BSL may be disposed on a portion of the touch electrodes SEN. The light-shielding pattern BSL may absorb light of a specific wavelength. The light-shielding pattern BSL may include an infrared absorbing material or an ultraviolet absorbing material. For example, the light-shielding pattern BSL may include an inorganic black pigment or an organic black pigment. The inorganic black pigment may be carbon black, and the organic black pigment may include, but is not limited to, at least one of lactam black, perylene black or aniline black.

The wavelength conversion layer WLCL may further include a code pattern CP determined by a plane shape of the light-shielding pattern BSL. The display device 10 may include the code pattern CP having a closed loop shape, thereby improving identification sensitivity of the code pattern CP. One code pattern CP may surround at least one of the first to third light emission areas EA1, EA2 and EA3 on a plane.

The display device 10 may include a light-shielding pattern BSL disposed on a portion of the plurality of touch electrodes SEN and a plurality of code patterns CP determined by the plane shape of the light-shielding pattern BSL, thereby receiving an input from an input device such as an input pen. At least one code pattern CP or combination of the code patterns CP may have position information according to a specific reference, and may correspond to preset data codes in one-to-one relationship. Therefore, the display device 10 may receive coordinate data generated without complex calculation and correction by using the data codes, thereby performing a corresponding function based on an accurate input coordinate, reducing costs, reducing power consumption and simplifying a driving process. Also, the display device 10 may include a light-shielding pattern BSL covering a portion of the touch electrode SEN, thereby being applied to all electronic devices having a touch function without restriction in size.

The first wavelength converter WLC1 may be disposed in the first light emission area EA1 on the first capping layer CAP1. The first wavelength converter WLC1 may be surrounded by the light-shielding part BK. The first wavelength converter WLC1 may include a first base resin BS1, a first scatterer SCT1 and a first wavelength shifter WLS1.

The second wavelength converter WLC2 may be disposed in the second light emission area EA1 on the first capping layer CAP1. The second wavelength converter WLC2 may be surrounded by the light-shielding part BK. The second wavelength converter WLC2 may include a second base resin BS2, a second scatterer SCT2 and a second wavelength shifter WLS2.

The light-transmitting unit LTU may be disposed in the third light emission area EA3 on the first capping layer CAP1. The light-transmitting unit LTU may be surrounded by the light-shielding part BK. The light-transmitting unit LTU may transmit incident light by maintaining a peak wavelength of the incident light. The light-transmitting unit LTU may include a third base resin BS3 and a third scatterer SCT3.

The second capping layer CAP2 may cover the first and second wavelength converters WLC1 and WLC2, the light transmitting unit LTU and the light-shielding part BK. For example, the second capping layer CAP2 may seal the first and second wavelength converters WLC1 and WLC2 and the light transmitting unit LTU to prevent the first and second wavelength converters WLC1 and WLC2 and the light-transmitting unit LTU from being damaged or contaminated. For example, the second capping layer CAP2 may include an inorganic material.

The third planarization layer OC3 may be disposed on the second capping layer to planarize upper ends of the first and second wavelength converters WLC1 and WLC2 and the light-transmitting unit LTU. For example, the third planarization layer OC3 may include an organic material.

The polarizing film POL may be disposed on the third planarization layer OC3. For example, the polarizing film POL may include a linear polarizing plate and a phase delay film such as a $\lambda/4$ plate (quarter-wave plate). The phase delay film and the linear polarizing plate may sequentially be deposited on the third planarization layer OC3.

Figure 22:
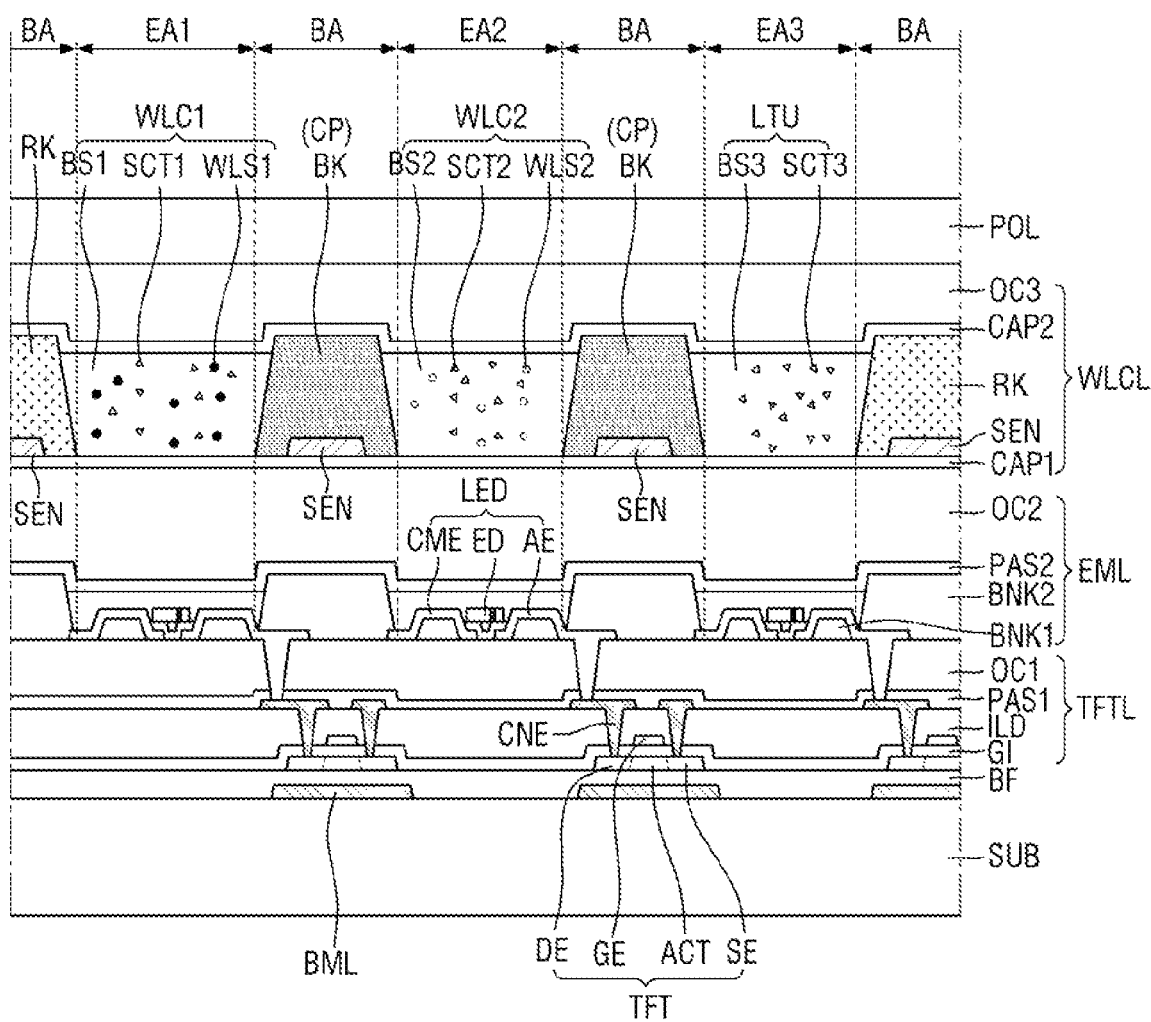
FIG. 22 is a cross-sectional view illustrating a display device according to an embodiment of the present disclosure.

FIG. 22 is a cross-sectional view illustrating a display device according to an embodiment of the present disclosure. The display device of FIG. 22 includes a light-shielding part BK different from that of FIG. 21 and further includes a reflective part RK, and the same elements as those described above will be described briefly.

Referring to FIG. 22, the display panel 100 may include a substrate SUB, a thin film transistor layer TFTL, a light-emitting element layer EML, a wavelength conversion layer WLCL, and a polarizing film POL.

The substrate SUB may be a base substrate or a base member. For example, the substrate SUB may include a glass material or a metal material. In another example, the substrate SUB may include a polymer resin such as polyimide (PI).

The thin film transistor layer TFTL may be disposed on the substrate SUB. The thin film transistor layer TFTL may include a buffer layer BF, a light-shielding layer BML, a thin film transistor TFT, a gate insulating layer GI, an interlayer dielectric layer ILD, a connection electrode CNE, a first passivation layer PAS1, and a first planarization layer OC1.

The light-emitting element layer EML may be disposed on the thin film transistor layer TFTL. The light-emitting element layer EML may include a light-emitting element LED, a first bank BNK1, a second bank BNK2, a second passivation layer PAS2, and a second planarization layer OC2.

The wavelength conversion layer WLCL may include a first capping layer CAP1, a light-shielding part BK, a reflective part RK, a plurality of touch electrodes SEN, a first wavelength converter WLC1, a second wavelength converter WLC2, a light-transmitting unit LTU, and a second capping layer CAP2.

The light-shielding part BK may be disposed in the light-shielding area BA on the first capping layer CAP1. The light-shielding part BK may overlap the second bank BNK2 in the thickness direction. The light-shielding part BK may absorb visible light, infrared rays and ultraviolet rays. The light-shielding part BK may prevent a color mixture from occurring due to visible light permeated among the first to third light emission areas EA1, EA2 and EA3, thereby improving a color reproduction rate of the display device 10.

For example, the light-shielding part BK may include an inorganic black pigment or an organic black pigment. The inorganic black pigment may be carbon black, and the organic black pigment may include, but is not limited to, at least one of lactam black, perylene black or aniline black.

The wavelength conversion layer WLCL may further include a code pattern CP determined by a plane shape of the light-shielding part BK. The light-shielding part BK may cover an upper surface and a side of the touch electrode SEN. The outer periphery of the code pattern CP may have a closed loop shape. When the code pattern CP surrounds the plurality of light emission areas, the code pattern CP may be formed in a planar mesh structure or a netted structure. The display device 10 may include the code pattern CP having a closed loop shape, thereby improving identification sensitivity of the code pattern CP. One code pattern CP may surround at least one of the first to third light emission areas EA1, EA2 and EA3 on a plane.

The reflective part RK may be disposed in another portion of the light-shielding area BA, in which the light-shielding part BK is not disposed, on the first capping layer CAP1. The reflective part RK may overlap the second bank BNK2 in the thickness direction. The reflective part RK may shield visible light and reflect infrared rays or ultraviolet rays. The reflective part RK may prevent a color mixture from occurring due to visible light permeated among the first to third light emission areas EA1, EA2 and EA3, thereby improving a color reproduction rate of the display device 10. The reflective part RK may be disposed in a lattice shape surrounding the first to third light emission areas EA1, EA2 and EA3 on a plane.

For example, the reflective part RK may include a reflective pigment and a black pigment. The black pigment may include, but is not limited to, at least one of carbon black, lactam black, perylene black or aniline black. The reflective part RK may be formed by adjusting specific gravity of the reflective pigment and the black pigment.

In another example, the reflective part RK may be coated with a material that reflects light of a specific wavelength. Therefore, the reflective part RK may shield visible light and reflect infrared rays or ultraviolet rays.

The plurality of touch electrodes SEN may be disposed in the light-shielding area BA on the first capping layer CAP1, and may be covered by the light-shielding part BK or the reflective part RK. The plurality of touch electrodes SEN may not need a separate touch sensor layer, and may be disposed in the wavelength conversion layer WLCL. When the camera photographs the wavelength conversion layer WLCL by using infrared rays or ultraviolet rays, the light-shielding part BK may be distinguished from the reflective part RK. Therefore, the code pattern CP may be photographed by the camera using infrared rays or ultraviolet rays, whereby image quality of the display device 10 should not be deteriorated.

Figure 23:
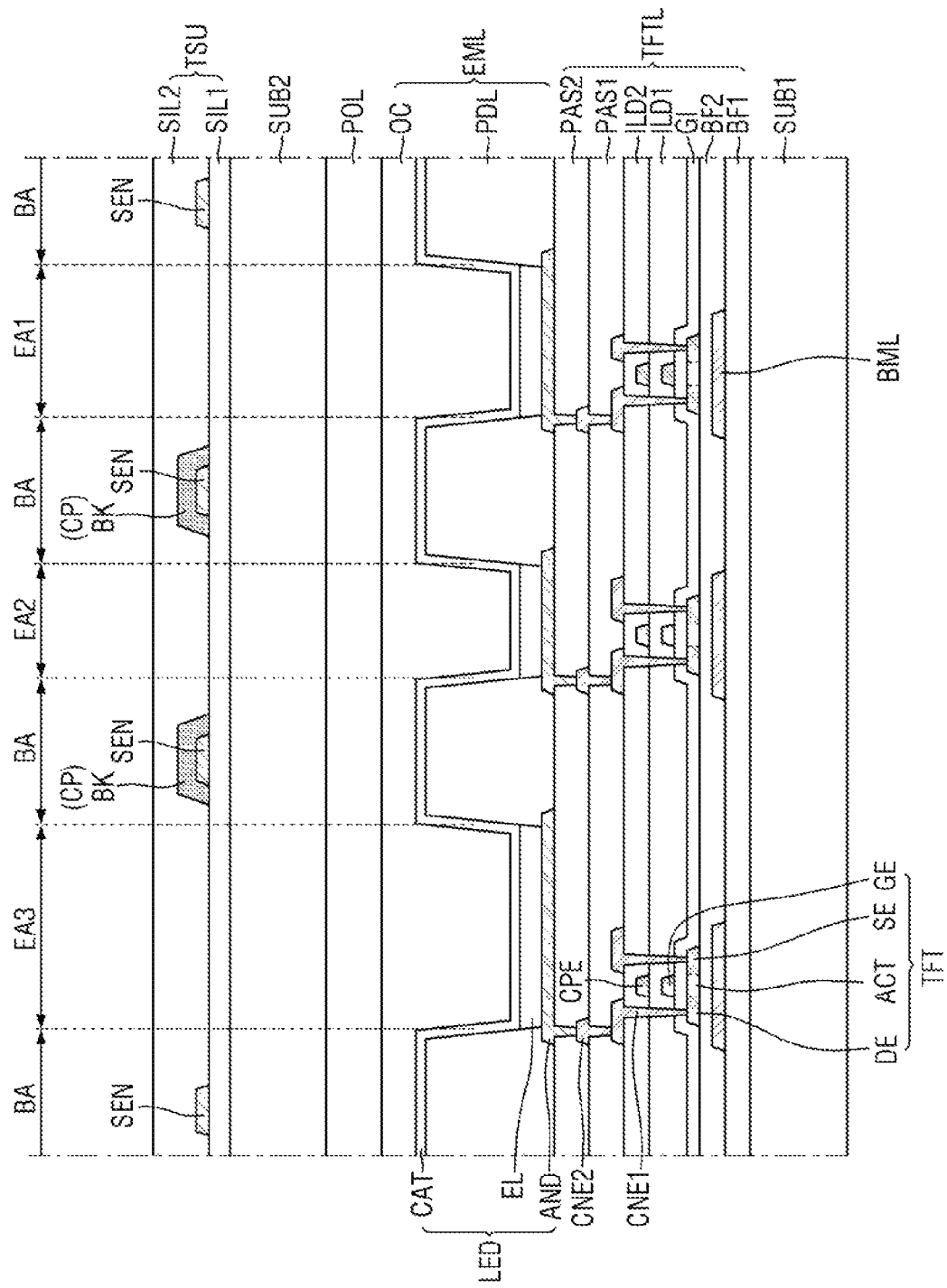
FIG. 23 is a cross-sectional view illustrating a display device according to an embodiment of the present disclosure.

FIG. 23 is a cross-sectional view illustrating a display device according to an embodiment of the present disclosure. The display device of FIG. 23 includes an upper configuration of the light-emitting element layer EML, which is different from that of FIG. 9, and the same elements as those described above will be described briefly.

Referring to FIG. 23, the display panel 100 may include a first substrate SUB1, a thin film transistor layer TFTL, a light-emitting element layer EML, a polarizing film POL, a second substrate SUB2, and a touch sensing unit TSU.

The first substrate SUB1 may be a base substrate or a base member. For example, the first substrate SUB1 may include a glass material or a metal material. In another example, the first substrate SUB1 may include a polymer resin such as polyimide (PI).

The thin film transistor layer TFTL may be disposed on the first substrate SUB1. The thin film transistor layer TFTL may include a first buffer layer BF1, a light-shielding layer BML, a second buffer layer BF2, a thin film transistor TFT, a gate insulating layer GI, a first interlayer dielectric layer ILD1, a capacitor electrode CPE, a second interlayer dielectric layer ILD2, a first connection electrode CNE1, a first passivation layer PAS1, a second connection electrode CNE2 and a second passivation layer PAS2.

The light-emitting element layer EML may be disposed on the thin film transistor layer TFTL. The light-emitting element layer EML may include a light-emitting element LED, a pixel defining layer PDL, and a planarization layer OC. The light-emitting element LED may include a pixel electrode AND, a light-emitting layer EL, and a common electrode CAT. The pixel defining layer PDL may define first to third light emission areas EA1, EA2 and EA3. The planarization layer OC may be disposed on the common electrode CAT to planarize an upper end of the light-emitting element layer EML.

The polarizing film POL may be disposed on the light-emitting element layer EML. For example, the polarizing film POL may include a linear polarizing plate and a phase delay film such as a λ/4 plate (quarter-wave plate).

The second substrate SUB2 may be disposed on the polarizing film POL. The second substrate SUB2 may be a base substrate or a base member. For example, the second substrate SUB2 may include a glass material or a metal material. In another example, the second substrate SUB2 may include a polymer resin such as polyimide (PI).

The touch sensing unit TSU may be disposed on the second substrate SUB2. The touch sensing unit TSU may include a first insulating layer SIL1 a plurality of touch electrodes SEN, a light-shielding part BK and a second insulating layer SIL2.

The first insulating layer SIL1 may be disposed on the second substrate SUB2. The first insulating layer SIL1 may have insulation and optical functions.

The plurality of touch electrodes SEN may be disposed on the first insulating layer SIL1 The plurality of touch electrodes SEN may not overlap the first to third light emission areas EA1, EA2 and EA3. The plurality of touch electrodes SEN may be formed in a planar mesh structure or a netted structure.

The light-shielding part BK may cover an upper surface and a side of a portion of the touch electrode SEN. The outer periphery of the code pattern CP may have a closed loop shape. When the code pattern CP surrounds the plurality of light emission areas, the code pattern CP may be formed in a planar mesh structure or a netted structure. The display device 10 may include the code pattern CP having a closed loop shape, thereby improving identification sensitivity of the code pattern CP. One code pattern CP may surround at least one of the first to third light emission areas EA1, EA2 and EA3 on a plane.

The light-shielding part BK may absorb light of a specific wavelength, and the touch electrode SEN may reflect light of a specific wavelength. The light-shielding part BK may include an infrared absorbing material or an ultraviolet absorbing material, and the plurality of touch electrodes SEN may include an infrared reflective material or an ultraviolet reflective material. For example, the light-shielding part BK may include an inorganic black pigment or an organic black pigment. The inorganic black pigment may be carbon black, and the organic black pigment may include, but is not limited to, at least one of lactam black, perylene black or aniline black. Therefore, when the camera photographs the touch sensing unit TSU by using infrared rays or ultraviolet rays, the light-shielding part BK covering a portion of the touch electrode SEN may be distinguished from another portion of the touch electrode SEN, which is not covered by the light-shielding part BK. The code pattern CP may be photographed by the camera using infrared rays or ultraviolet rays, whereby image quality of the display device 10 should not be deteriorated.

The second insulating layer SIL2 may cover the light-shielding part BK, the touch electrodes SEN, which are not covered by the light-shielding part BK, and the second substrate SUB2. The second insulating layer SIL2 may have insulation and optical functions.

Figure 24:
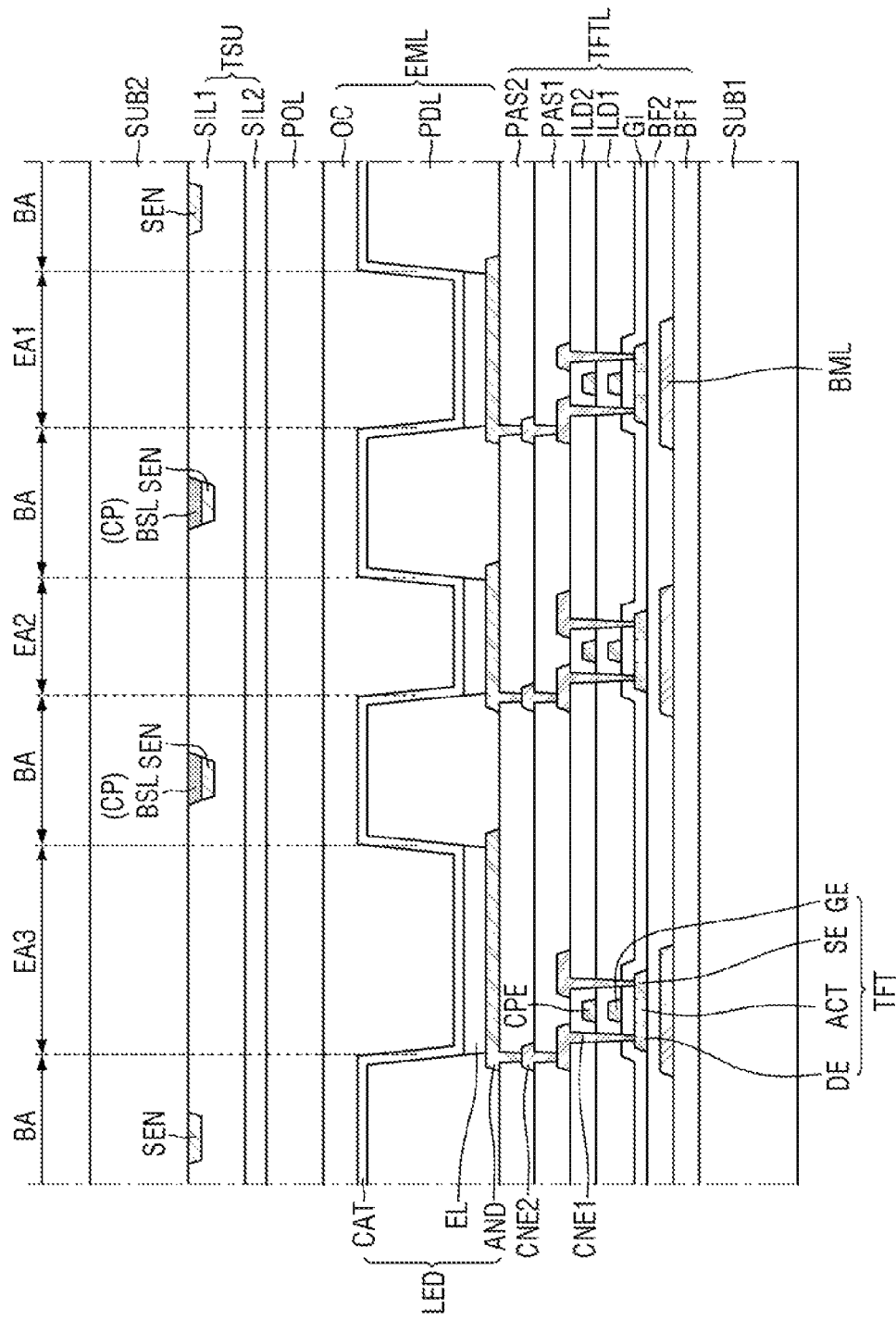
FIG. 24 is a cross-sectional view illustrating a display device according to an embodiment of the present disclosure.

FIG. 24 is a cross-sectional view illustrating a display device according to an embodiment of the present disclosure. The display device of FIG. 24 has an upper configuration of the polarizing film POL, which is different from that of the display device of FIG. 23, and the same elements as those described above will be described briefly.

Referring to FIG. 24, the display panel 100 may include a first substrate SUB1, a thin film transistor layer TFTL, a light-emitting element layer EML, a polarizing film POL, a touch sensing unit TSU, and a second substrate SUB2.

The second substrate SUB2 may be opposite to the first substrate SUB1. The second substrate SUB2 may be bonded to the first substrate SUB1 after a light-shielding pattern BSL, a plurality of touch electrodes SEN, a first insulating layer SIL1 and a second insulating layer SIL2 are formed on the second substrate SUB2. The second substrate SUB2 may be a base substrate or a base member. For example, the second substrate SUB2 may include a glass material or a metal material. In another example, the second substrate SUB2 may include a polymer resin such as polyimide (PI).

The touch sensing unit TSU may include a light-shielding pattern BSL, a plurality of touch electrodes SEN, a first insulating layer SIL1 and a second insulating layer S IL2.

The light-shielding pattern BSL may be disposed below the second substrate SUB2. The light-shielding pattern BSL may be disposed on one surface of the second substrate SUB2 facing the first substrate SUB1. The light-shielding pattern BSL may be disposed on a portion of the touch electrode SEN. The light-shielding pattern BSL may absorb light of a specific wavelength, and another portion of the touch electrode SEN, which is not overlapped with the light-shielding pattern BSL, may reflect light of a specific wavelength. The light-shielding pattern BSL may include an infrared absorbing material or an ultraviolet absorbing material, and the plurality of touch electrodes SEN may include an infrared reflective material or an ultraviolet reflective material. For example, the light-shielding pattern BSL may include an inorganic black pigment or an organic black pigment. The inorganic black pigment may be carbon black, and the organic black pigment may include, but is not limited to, at least one of lactam black, perylene black or aniline black.

A portion of the touch electrode SEN may be disposed below the light-shielding pattern BSL, and another portion of the touch electrode SEN may be disposed below the second substrate SUB2. In an embodiment, the plurality of touch electrodes SEN do not overlap the first to third light emission areas EA1, EA2 and EA3.

The touch sensing unit TSU may further include a code pattern CP determined by the plane shape of the light-shielding pattern BSL. The display device 10 may include the code pattern CP having a closed loop shape, thereby improving identification sensitivity of the code pattern CP. One code pattern CP may surround at least one of the first to third light emission areas EA1, EA2 and EA3 on a plane.

The first insulating layer SIL1 may cover the plurality of touch electrodes SEN, the light-shielding pattern BSL and the second substrate SUB2. The second insulating layer SIL2 may be disposed between the polarizing film POL and the first insulating layer SIL1 The first and second insulating layers SIL1 and SIL2 may have insulation and optical functions.

Figure 25:
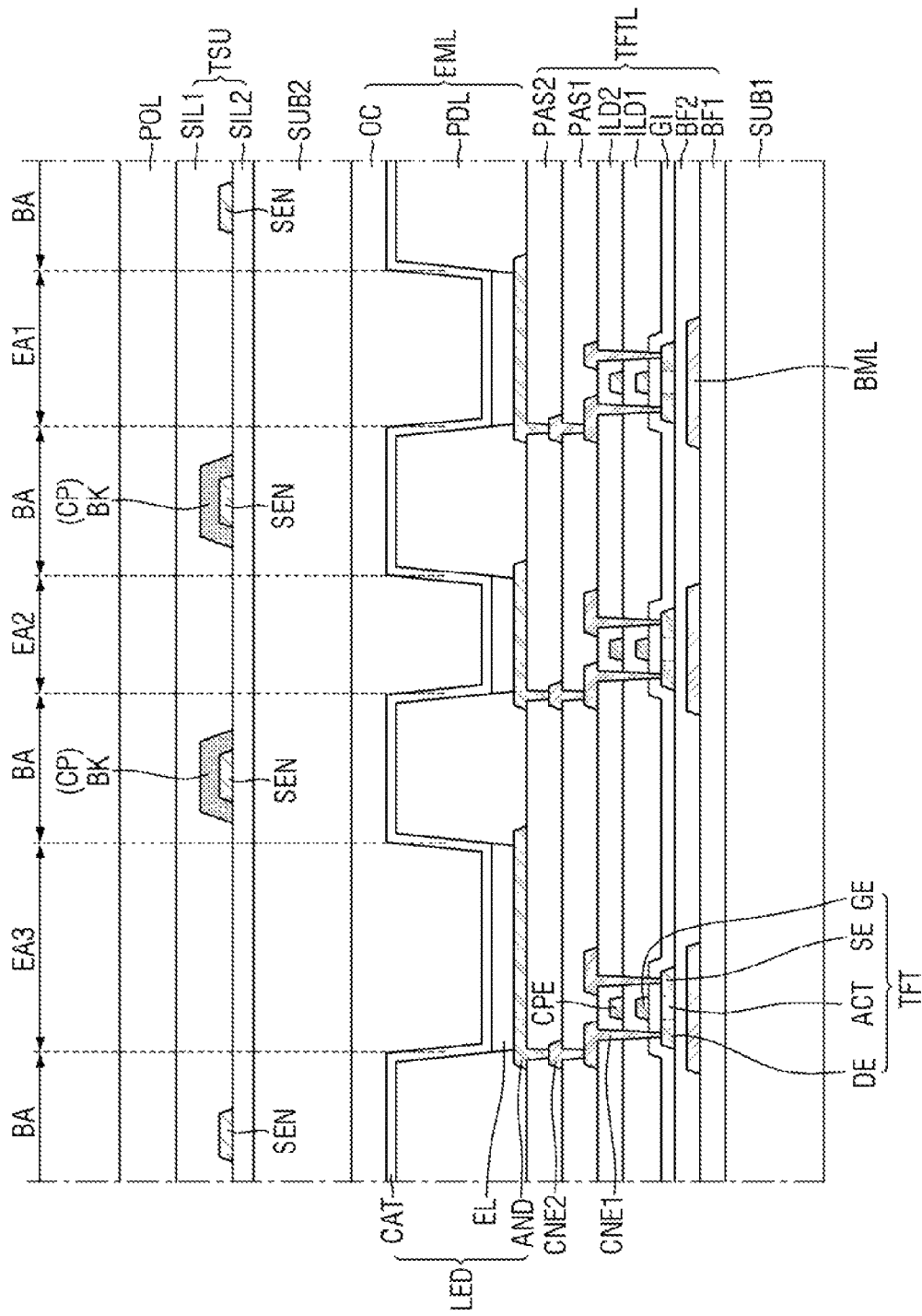
FIG. 25 is a cross-sectional view illustrating a display device according to an embodiment of the present disclosure.

FIG. 25 is a cross-sectional view illustrating a display device according to an embodiment of the present disclosure. The display device of FIG. 25 has a position of the polarizing film POL, which is different from that of the display device of FIG. 23, and the same elements as those described above will be described briefly.

Referring to FIG. 25, the display panel 100 may include a first substrate SUB1, a thin film transistor layer TFTL, a light-emitting element layer EML, a second substrate SUB2, a touch sensing unit TSU, and a polarizing film POL.

The second substrate SUB2 may be disposed on the light-emitting element layer EML. The second substrate SUB2 may be a base substrate or a base member. For example, the second substrate SUB2 may include a glass material or a metal material. In another example, the second substrate SUB2 may include a polymer resin such as polyimide (PI).

The touch sensing unit TSU may include a first insulating layer SIL1 a second insulating layer SIL2, a plurality of touch electrodes SEN, and a light-shielding part BK.

The second insulating layer SIL2 may be disposed on the second substrate SUB2. The second insulating layer SIL2 may have insulation and optical functions.

The plurality of touch electrodes SEN may be disposed on the second insulating layer SIL2. In an embodiment, the plurality of touch electrodes SEN do not overlap the first to third light emission areas EA1, EA2 and EA3. The plurality of touch electrodes SEN may be formed in a planar mesh structure or a netted structure.

The light-shielding part BK may cover an upper surface and a side of a portion of the touch electrode SEN. The outer periphery of the code pattern CP may have a closed loop shape. When the code pattern CP surrounds the plurality of light emission areas, the code pattern CP may be formed in a planar mesh structure or a netted structure. The display device 10 may include the code pattern CP having a closed loop shape, thereby improving identification sensitivity of the code pattern CP.

The light-shielding part BK may absorb light of a specific wavelength, and the touch electrode SEN may reflect light of a specific wavelength. The light-shielding part BK may include an infrared absorbing material or an ultraviolet absorbing material, and the plurality of touch electrodes SEN may include an infrared reflective material or an ultraviolet reflective material.

The first insulating layer SIL1 may cover the light-shielding part BK, the touch electrode SEN that is not covered by the light-shielding part BK, and the second insulating layer SIL2. The first insulating layer SIL1 may have insulation and optical functions.

The polarizing film POL may be disposed on the first insulating layer SIL1 For example, the polarizing film POL may include a linear polarizing plate and a phase delay film such as a λ/4 plate (quarter-wave plate).

Figure 26:
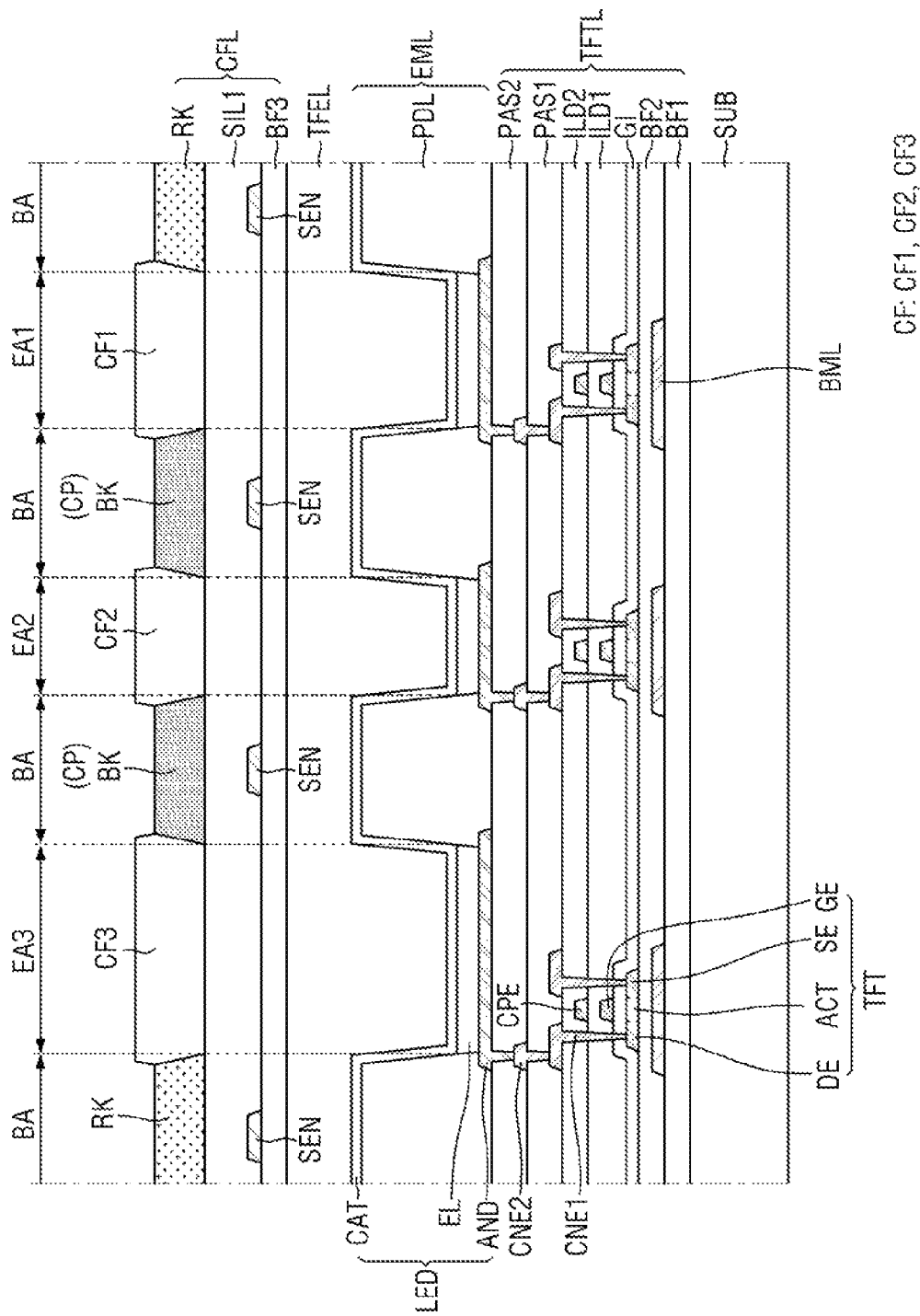
FIG. 26 is a cross-sectional view illustrating a display device according to an embodiment of the present disclosure.

FIG. 26 is a cross-sectional view illustrating a display device according to an embodiment of the present disclosure. The display device of FIG. 26 has a configuration of a plurality of touch electrodes SEN, which is different from that of the display device of FIG. 19, and the same elements as those described above will be described briefly.

Referring to FIG. 26, the display panel 100 may include a substrate SUB, a thin film transistor layer TFTL, a light-emitting element layer EML, an encapsulation layer TFEL, and a color filter layer CFL.

The color filter layer CFL may be disposed on the encapsulation layer TFEL. The color filter layer CFL may include a third buffer layer BF3, a plurality of touch electrodes SEN, a first insulating layer SIL1 a plurality of color filters CF, a light-shielding part BK, and a reflective part RK.

The plurality of touch electrodes SEN may be disposed on the third buffer layer BF3. In an embodiment, the plurality of touch electrodes SEN do not overlap the first to third light emission areas EA1, EA2 and EA3.

The first insulating layer SIL1 may be disposed on the plurality of touch electrodes SEN and the third buffer layer BF3. The first insulating layer SIL1 may have insulation and optical functions.

The plurality of color filters CF may include first to third color filters CF1, CF2 and CF3. Each of the first to third color filters CF1, CF2 and CF3 may be disposed to correspond to the first to third light emission areas EA1, EA2 and EA3 on the first insulating layer SIL1 The first to third color filters CF1, CF2 and CF3 may absorb a portion of light incident from the outside of the display device 10 to reduce reflective light due to external light. Therefore, the first to third color filters CF1, CF2 and CF3 may prevent color distortion due to external light reflection from occurring.

The light-shielding part BK may be disposed in a portion of the light-shielding area BA on the first insulating layer SIL1 The light-shielding part BK may overlap the pixel defining layer PDL in the thickness direction. The light-shielding part BK may absorb visible light, infrared rays and ultraviolet rays. The light-shielding part BK may prevent a color mixture from occurring due to visible light permeated among the first to third light emission areas EA1, EA2 and EA3, thereby improving a color reproduction rate of the display device 10.

The color filter layer CFL may further include a code pattern CP determined by a plane shape of the light-shielding part BK. The light-shielding part BK may cover an upper surface and a side of the touch electrode SEN. The outer periphery of the code pattern CP may have a closed loop shape. When the code pattern CP surrounds the plurality of light emission areas, the code pattern CP may be formed in a planar mesh structure or a netted structure. The display device 10 may include the code pattern CP having a closed loop shape, thereby improving identification sensitivity of the code pattern CP. One code pattern CP may surround at least one of the first to third light emission areas EA1, EA2 and EA3 on a plane. In an embodiment, the code pattern CP does not overlap the first to third light emission areas EA1, EA2 and EA3. Therefore, the display device 10 may prevent luminance of light emitted from the first to third light emission areas EA1, EA2 and EA3 from being reduced by the light-shielding part BK or the code pattern CP.

The reflective part RK may be disposed in another portion of the light-shielding area BA, in which the light-shielding part BK is not disposed, on the encapsulation layer TFEL. The reflective part RK may overlap the pixel defining layer PDL in the thickness direction. The reflective part RK may include an absorbing material of visible light, and may include an infrared or ultraviolet reflective material. The reflective part RK may shield visible light and reflect infrared rays or ultraviolet rays. The reflective part RK may prevent a color mixture from occurring due to visible light permeated among the first to third light emission areas EA1, EA2 and EA3, thereby improving a color reproduction rate of the display device 10. The reflective part RK may be disposed in a lattice shape surrounding the first to third light emission areas EA1, EA2 and EA3 on a plane.

Figure 27:
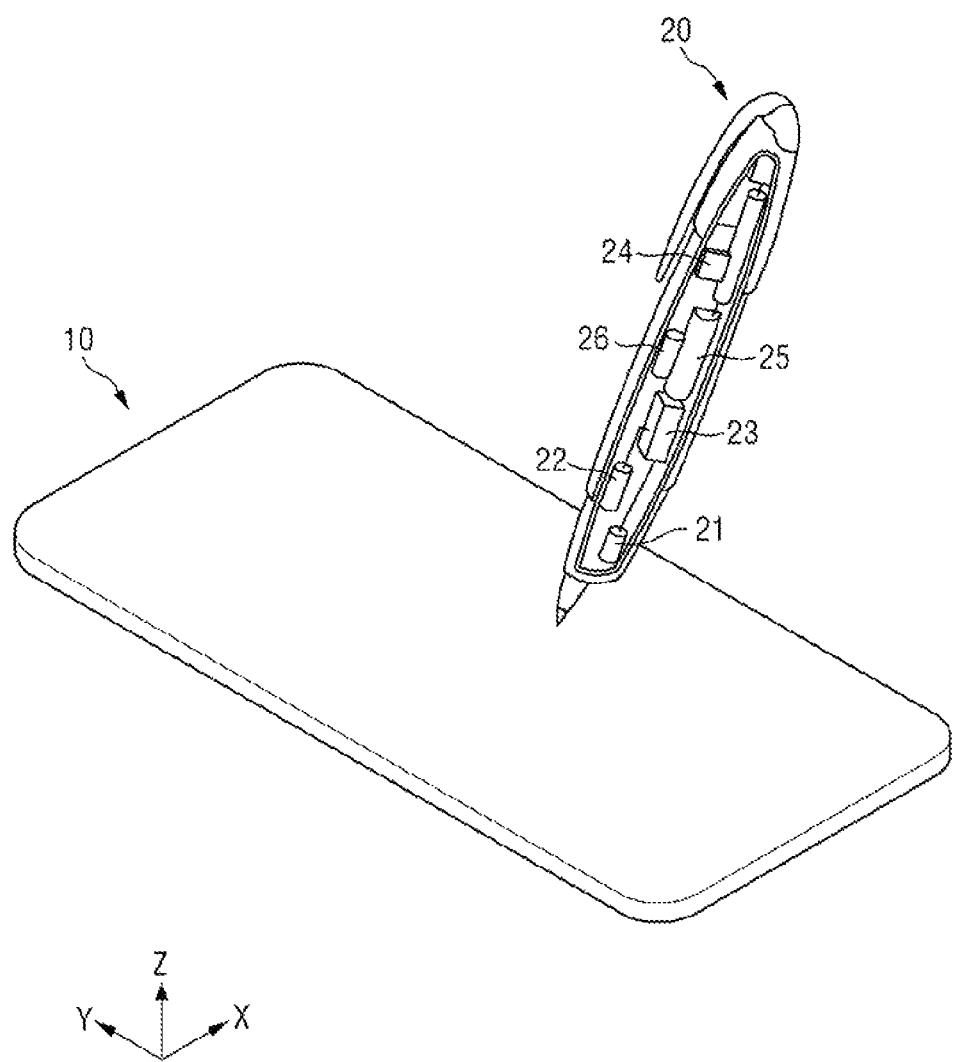
FIG. 27 is a perspective view illustrating a touch input system according to an embodiment of the present disclosure.
Figure 28:
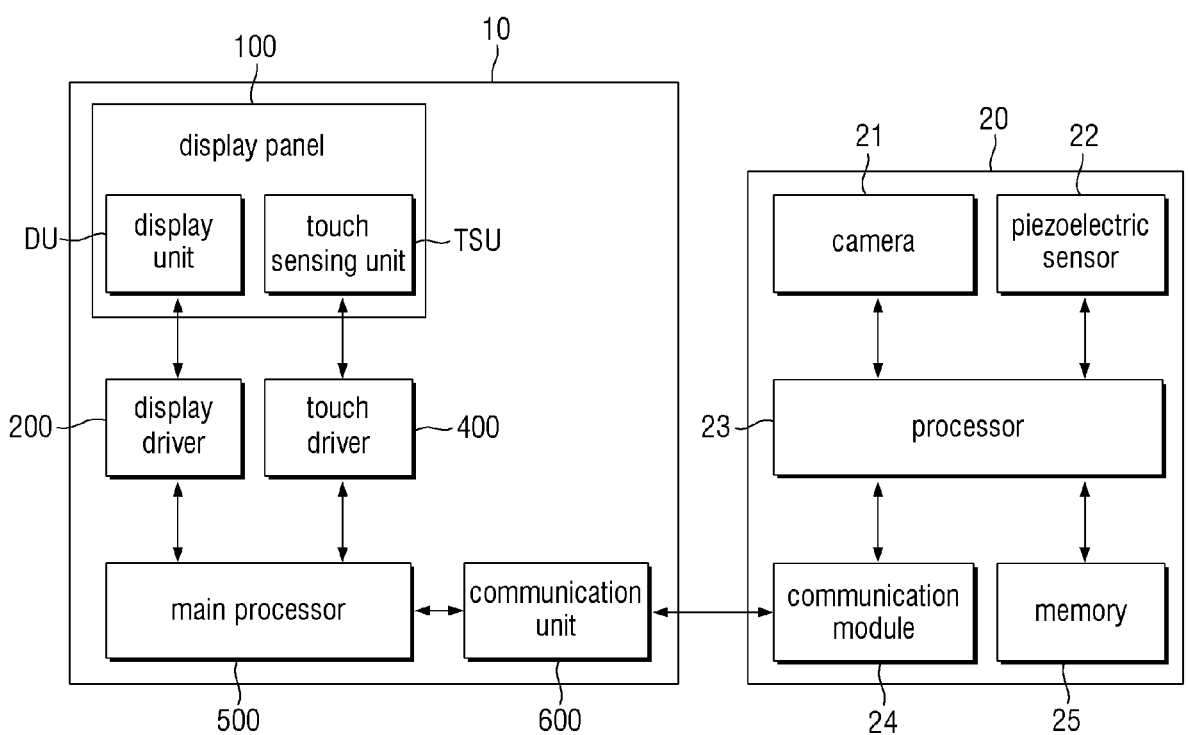
FIG. 28 is a block view illustrating a display device and an input device in a touch input system according to an embodiment of the present disclosure.

FIG. 27 is a perspective view illustrating a touch input system according to an embodiment of the present disclosure, and FIG. 28 is a block view illustrating a display device and an input device in a touch input system according to an embodiment of the present disclosure.

Referring to FIGS. 27 and 28, the touch input system may include a display device 10 and an input device 20.

The display device 10 may include a display panel 100, a display driver 200, a touch driver 400, a main processor 500, and a communication unit 600.

The display panel 100 may include a display unit DU and a touch sensing unit TSU. The display unit DU may include a plurality of pixels to display an image.

The touch sensing unit TSU may include a plurality of touch electrodes SEN to sense a user's touch in a capacitance manner. The display device 10 may include a code pattern CP to sense a touch of the input device 20. The code pattern CP may be determined by a plane shape of the light-shielding part BK, the touch electrode SEN or the light-shielding pattern BSL to have position information. At least one code pattern CP or combination of the code patterns CP may correspond to values of preset data codes.

The display driver 200 may output signals and voltages for driving the display unit DU. The display driver 200 may supply data voltages to the data lines. The display driver 200 may supply a power supply voltage to a power line and supply gate control signals to the gate driver.

The touch driver 400 may be connected to the touch sensing unit TSU. The touch driver 400 may supply a touch driving signal to the plurality of touch electrodes SEN of the touch sensing unit TSU, and may sense a change amount in capacitance between the plurality of touch electrodes SEN. The touch driver 400 may calculate a user's input coordinates based on the change amount in capacitance between the plurality of touch electrodes.

The main processor 500 may control all functions of the display device 10. For example, the main processor 500 may supply digital video data to the display driver 200 so that the display panel 100 displays an image. For example, the main processor 500 may receive touch data from the touch driver 400 to determine the user's input coordinates, generate digital video data based on the input coordinates or execute an application indicated by an icon displayed on the user's input coordinates. In another example, the main processor 500 may receive coordinate data from the input device 20 to determine input coordinates of the input device 20, generate digital video data based on the input coordinates or execute an application indicated by an icon displayed on the input coordinates of the input device 20.

The communication unit 600 may perform wired/wireless communication with an external device. For example, the communication unit 600 may transmit and receive a communication signal to and from a communication module 24 of the input device 20. The communication unit 600 may receive coordinate data comprised of data codes from the input device 20, and may provide the coordinate data to the main processor 500. The communication unit 600 may be implemented by a transceiver or a modem. The transceiver may include at least one of a receiver or a transmitter.

The input device 20 may include a camera 21, a piezoelectric sensor 22, a processor 23, a communication module 24, a memory 25, and a battery 26. For example, the input device 20 may be an input pen that generates coordinate data by using an optical scheme. The input pen may be, but is not limited to, a smart pen, an electromagnetic pen or an active pen.

The camera 21 may be disposed in front of the input device 20. The camera 21 may photograph a code pattern CP determined by a plane shape of the light-shielding part BK, the touch electrode SEN or the light-shielding pattern BSL. The camera 21 may continuously photograph the code pattern CP of the corresponding position in accordance with movement of the input device 20. The camera 21 may provide the photographed image to the processor 23.

The piezoelectric sensor 22 may sense a pressure that is applied from the input device 20 to the display device 10. The piezoelectric sensor 22 may provide pressure information of the input device 20 to the processor 23.

The processor 23 may receive an image of the code pattern CP from the camera 21. The processor 23 may convert the code pattern CP into corresponding data codes, and may combine the data codes to generate coordinate data.

The processor 23 may transmit the generated coordinate data to the display device 10 through the communication module 24.

The processor 23 may receive an image of the code pattern CP and convert at least one code pattern CP or combination of the code patterns CP into data codes in one-to-one relationship, thereby quickly generating coordinate data without complex calculation and correction. Therefore, the touch input system may perform a corresponding function based on an accurate input coordinate, reduce costs, reduce power consumption and simplify a driving process. Also, the touch input system may include a plurality of code patterns CP provided in a touch sensing layer TSU, a color filter layer CFL or a wavelength conversion layer WLCL, thereby being applied to all electronic devices having a touch function without restriction in size.

The communication module 24 may perform wired/wireless communication with an external device. For example, the communication module 24 may transmit and receive a communication signal to and from the communication unit 600 of the display device 10. The communication module 24 may receive coordinate data comprised of data codes from the processor 23 and provide the coordinate data to the communication unit 600. For example, the communication module 24 may be a transceiver or a modem.

The memory 25 may store data required for driving of the input device 20. The input device 20 may convert at least one code pattern CP or combination of the code patterns CP into data codes corresponding thereto in a one-to-one relationship, and may directly provide the coordinate data to the display device 10. Therefore, the memory 25 may have a relatively small capacity.

What is claimed is:

1. A display device comprising:
    a display layer comprising a plurality of light emission areas for emitting light;
    a plurality of touch electrodes disposed on the display layer to sense a touch and surround the plurality of light emission areas; and
    a light-shield disposed on a portion of the plurality of touch electrodes, wherein the light-shield covers an upper surface and a side surface of each of the touch electrodes of the portion; and
    a code pattern determined by a planar shape of the light-shield to have position information,
    wherein the light-shield absorbs light of a specific wavelength, and another portion of the touch electrodes, which is not overlapped with the light-shield, reflects light of the specific wavelength,
    wherein the position information indicates a first position when the planar shape surrounds a first number of the light emission areas and indicates a second position different from the first position when the planar shape surrounds a second number of the light emission areas different from the first number.

2. The display device of claim 1, wherein an outer periphery of the code pattern has a closed loop shape.

3. The display device of claim 2, wherein, when the code pattern surrounds the plurality of light emission areas, the code pattern has a mesh structure on a plane.

4. The display device of claim 3, wherein the plurality of light emission areas comprise first to third light emission areas having their respective sizes different from each other, and perimeters of the code patterns surrounding each of the first to third light emission areas are different from each other.

5. The display device of claim 1, wherein the display layer comprises:
a substrate;
a thin film transistor layer disposed on the substrate, comprising a plurality of thin film transistors;
a light-emitting element layer disposed on the thin film transistor layer, comprising a plurality of light-emitting elements; and
an encapsulation layer covering the light-emitting element layer,
wherein the plurality of touch electrodes are disposed on the encapsulation layer.

6. The display device of claim 1, further comprising a plurality of color filters disposed in the plurality of light emission areas on the display layer,
wherein the light-shield surrounds a portion of the plurality of color filters on the display layer.

7. The display device of claim 6, further comprising a reflective layer disposed on another portion of the touch electrodes on the display layer, surrounding another portion of the plurality of color filters.

8. The display device of claim 7, wherein the reflective layer includes an absorbing material to absorb visible light and a light reflective material to reflect light of the specific wavelength.

9. The display device of claim 1, further comprising:
an insulating layer covering the light-shield; and
a plurality of color filters disposed in the plurality of light emission areas on the insulating layer,
wherein the light-shield surrounds a portion of the plurality of color filters on the insulating layer.

10. The display device of claim 1, wherein the display layer comprises:
a substrate;
a thin film transistor layer disposed on the substrate, comprising a plurality of thin film transistors;
a light-emitting element layer disposed on the thin film transistor layer, comprising a plurality of light-emitting elements; and
a wavelength converter disposed on the light-emitting element layer to correspond to the plurality of light emission areas, converting a peak wavelength of light provided from the plurality of light-emitting elements.

11. The display device of claim 1, wherein the display layer comprises:
a first substrate;
a thin film transistor layer disposed on the first substrate, comprising a plurality of thin film transistors;
a light-emitting element layer disposed on the thin film transistor layer, comprising a plurality of light-emitting elements;
a polarizing film disposed on the light-emitting element layer; and
a second substrate disposed on the polarizing film, and the plurality of touch electrodes are disposed on the second substrate.

12. The display device of claim 1, wherein the display layer comprises:
a first substrate;
a thin film transistor layer disposed on the first substrate, comprising a plurality of thin film transistors; and
a light-emitting element layer disposed on the thin film transistor layer, comprising a plurality of light-emitting elements, and
further comprises:
a second substrate disposed on the light-emitting element layer;
a touch sensing layer disposed on the second substrate, comprising the plurality of touch electrodes and the light-shield; and
a polarizing film disposed on the touch sensing layer.

13. A display device comprising:
a display layer comprising a plurality of light emission areas for emitting light;
a plurality of touch electrodes disposed on the display layer to sense a touch and surround the plurality of light emission areas;
a light-shield covering a portion of the plurality of touch electrodes, wherein the light-shield covers an upper surface and a side surface of each of the touch electrodes of the portion; and
a code pattern determined by a planar shape of another portion of the touch electrodes, which is not covered by the light-shield, to have position information,
wherein the light-shield includes a light absorbing material to absorb light of a specific wavelength, and another portion of the touch electrodes, which is not covered by the light-shield, includes a light reflective material to reflect light of the specific wavelength,
wherein the position information indicates a first position when the planar shape surrounds a first number of the light emission areas and indicates a second position different from the first position when the planar shape surrounds a second number of the light emission areas different from the first number.

14. The display device of claim 13, wherein an outer periphery of the code pattern has a closed loop shape, the code pattern surrounds the plurality of light emission areas, and the code pattern has a mesh structure on a plane.

15. The display device of claim 13, wherein the display layer comprises:
a substrate;
a thin film transistor layer disposed on the substrate, comprising a plurality of thin film transistors;
a light-emitting element layer disposed on the thin film transistor layer, comprising a plurality of light-emitting elements; and
an encapsulation layer covering the light-emitting element layer,
wherein the plurality of touch electrodes are disposed on the encapsulation layer.

16. A display device comprising:
a display layer comprising a plurality of light emission areas for emitting light;
a plurality of touch electrodes disposed on the display layer to sense a touch and surround the plurality of light emission areas;
a first light-shield disposed on a portion of the plurality of touch electrodes;
a second light-shield covering the plurality of touch electrodes and the first light-shield; and
a code pattern determined by a planar shape of the first light-shield to have position information,
wherein the first light-shield includes a light-absorbing material to absorb light of a specific wavelength, and
wherein the second light-shield is configured to transmit light of the specific wavelength,
wherein the position information indicates a first position when the planar shape surrounds a first number of the light emission areas and indicates a second position different from the first position when the planar shape surrounds a second number of the light emission areas different from the first number.

17. The display device of claim 16, wherein another portion of the touch electrodes, which is not overlapped with the light-shielding pattern, includes a light-reflective material to reflect light of the specific wavelength.

18. The display device of claim 16, wherein an outer periphery of the code pattern has a closed loop shape, the code pattern surrounds the plurality of light emission areas, and the code pattern has a mesh structure on a plane.

19. The display device of claim 16, wherein the display layer comprises:
a first substrate;
a thin film transistor layer disposed on the first substrate, comprising a plurality of thin film transistors; and
a light-emitting element layer disposed on the thin film transistor layer, comprising a plurality of light-emitting elements, and
further comprises:
a wavelength conversion layer disposed on the light-emitting element layer to correspond to the plurality of light emission areas, comprising a plurality of wavelength converters converting a peak wavelength of light provided from the plurality of light-emitting elements; and
a second substrate disposed on the wavelength conversion layer, and
the first light-shield is disposed below the second substrate to surround a portion of the plurality of wavelength converters.

20. The display device of claim 16, wherein the display layer comprises:
a first substrate;
a thin film transistor layer disposed on the first substrate, comprising a plurality of thin film transistors; and
a light-emitting element layer disposed on the thin film transistor layer, comprising a plurality of light-emitting elements, and
further comprises:
a plurality of wavelength converters disposed on the light-emitting element layer to correspond to the light emission areas, converting a peak wavelength of light provided from the plurality of light-emitting elements, and
the plurality of touch electrodes are disposed on the light-emitting element layer to surround the plurality of wavelength converters.

21. The display device of claim 16, wherein the display layer comprises:
a first substrate;
a thin film transistor layer disposed on the first substrate, comprising a plurality of thin film transistors; and
a light-emitting element layer disposed on the thin film transistor layer, comprising a plurality of light-emitting elements, and
further comprises:
a polarizing film disposed on the light-emitting element layer;
a touch sensing layer disposed on the polarizing film, comprising the plurality of touch electrodes and the first light-shield; and
a second substrate disposed on the touch sensing layer, and
the first light-shield is disposed on a lower surface of the second substrate.

22. A touch input system comprising:
a display device for displaying an image; and
an input device for inputting a touch to the display device,
wherein the display device comprises:
a display layer comprising a plurality of light emission areas for emitting light;
a plurality of touch electrodes disposed on the display layer to sense a touch and surround the plurality of light emission areas;
a light-shield covering a portion of the plurality of touch electrodes, where the light-shield covers an upper surface and a side surface of each of the touch electrodes of the portion; and
a code pattern determined by a planar shape of the light-shield to have position information,
wherein the light-shield absorbs light of a specific wavelength, and another portion of the touch electrodes, which is not covered by the light-shield, reflects light of the specific wavelength, and
the input device converts the code pattern into preset data codes by photographing the code pattern and transmits coordinate data determined from the data codes to the display device, wherein the coordinate data indicates a first position when the code pattern surrounds a first number of the light emission areas and a second position different from the first position when the code pattern surrounds a second number of the light emission area different from the first number.

23. The touch input system of claim 22, wherein the input device comprises:
a camera for photographing the code pattern;
a processor for analyzing an image of the code pattern to convert the image into preset data codes and generating coordinate data from the preset data codes; and
a communication module for transmitting the coordinate data to the display device.

24. The touch input system of claim 23, wherein the display device further comprises:
a communication unit for receiving the coordinate data from the communication module; and
a main processor for generating image data based on the coordinate data,
wherein the display layer is for displaying an image based on the image data.

* * * * *